(12) United States Patent
Yin et al.

(10) Patent No.: US 12,328,941 B2
(45) Date of Patent: Jun. 10, 2025

(54) CURVED LIGHT-EMITTING SUBSTRATE

(71) Applicant: Shanghai Tianma Micro-Electronics Co., Ltd., Shanghai (CN)

(72) Inventors: Zhenhai Yin, Shanghai (CN); Shanshan Liu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 530 days.

(21) Appl. No.: 17/729,833

(22) Filed: Apr. 26, 2022

(65) Prior Publication Data

US 2023/0275102 A1    Aug. 31, 2023

(30) Foreign Application Priority Data

Feb. 28, 2022    (CN) .......................... 202210185227.2

(51) Int. Cl.
*H10D 86/60* (2025.01)
*H01L 23/00* (2006.01)
(Continued)

(52) U.S. Cl.
CPC ............. *H10D 86/60* (2025.01); *H01L 24/02* (2013.01); *H01L 24/03* (2013.01); *H01L 24/05* (2013.01); *H01L 24/13* (2013.01); *H01L 25/167* (2013.01); *H10D 86/021* (2025.01); *H10D 86/451* (2025.01); *H01L 24/16* (2013.01); *H01L 2224/02125* (2013.01); *H01L 2224/03011* (2013.01); *H01L 2224/039* (2013.01); *H01L 2224/05553* (2013.01); *H01L 2224/05558* (2013.01); *H01L 2224/05573* (2013.01); *H01L 2224/13014* (2013.01); *H01L 2224/16148* (2013.01); *H01L 2924/12041* (2013.01)

(58) Field of Classification Search
None
See application file for complete search history.

(56) References Cited

U.S. PATENT DOCUMENTS

2013/0306964 A1* 11/2013 Han ...................... H01L 33/382
257/77
2015/0316957 A1* 11/2015 Cho ......................... G09G 3/03
345/156

(Continued)

FOREIGN PATENT DOCUMENTS

CN        104167513 A    11/2014
CN        106973496 B     6/2019

*Primary Examiner* — Bo B Jang
(74) *Attorney, Agent, or Firm* — Anova Law Group, PLLC

(57) ABSTRACT

A curved light-emitting substrate and its formation method, and a display apparatus are provided in the present disclosure. The curved light-emitting substrate includes a substrate; an array layer, disposed on a side of the substrate; a plurality of light-emitting elements, electrically connected to the array layer, where a light-emitting element of the plurality of light-emitting elements includes a light-emitting main body and a first soldering pad on a side of the light-emitting main body facing the array layer; a second soldering pad which is on a side of the array layer facing the light-emitting element and electrically connected to the first soldering pad; and a flexible padding layer, between the light-emitting main body and the array layer along a first direction, where the first direction is perpendicular to a surface of the array layer.

21 Claims, 21 Drawing Sheets

(51) Int. Cl.
*H01L 25/16* (2023.01)
*H10D 86/01* (2025.01)
*H10D 86/40* (2025.01)

(56) References Cited

U.S. PATENT DOCUMENTS

2021/0391308 A1* 12/2021 Sim .................. H01L 33/38
2024/0047477 A1* 2/2024 Hu .................. H01L 25/167

* cited by examiner

A-A

CURVED LIGHT-EMITTING SUBSTRATE

CROSS-REFERENCE TO RELATED APPLICATION

This application claims the priority of Chinese Patent Application No. 202210185227.2, filed on Feb. 28, 2022, the content of which is incorporated herein by reference in its entirety.

TECHNICAL FIELD

The present disclosure generally relates to the field of display technology and, more particularly, relates to a curved light-emitting substrate and its formation method, and a display apparatus.

BACKGROUND

With continuous development of electronic display technology, users have higher requirements for electronic display apparatuses. Recently, light-emitting substrates with curved structures have been developed. For example, light-emitting substrates with curved structures may be formed using flexible electronic apparatuses. The flexible electronic apparatus may be able to be bent or folded and may normally be formed by mounting light-emitting elements on a flexible base substrate.

In the existing technology, the display apparatus with the curved structure may also be formed using a rigid substrate, that is, light-emitting elements may be formed on the rigid substrate. For the curved light-emitting substrate formed by the rigid substrate, since the substrate is rigid, the light-emitting elements and the rigid substrate may be deformed to generate stress after the rigid substrate is bent, resulting in poor light-emitting reliability of the curved light-emitting substrate.

SUMMARY

One aspect of the present disclosure provides a curved light-emitting substrate. The curved light-emitting substrate includes a substrate; an array layer, disposed on a side of the substrate; a plurality of light-emitting elements, electrically connected to the array layer, where a light-emitting element of the plurality of light-emitting elements includes a light-emitting main body and a first soldering pad on a side of the light-emitting main body facing the array layer; a second soldering pad which is on a side of the array layer facing the light-emitting element and electrically connected to the first soldering pad; and a flexible padding layer, between the light-emitting main body and the array layer along a first direction, where the first direction is perpendicular to a surface of the array layer.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
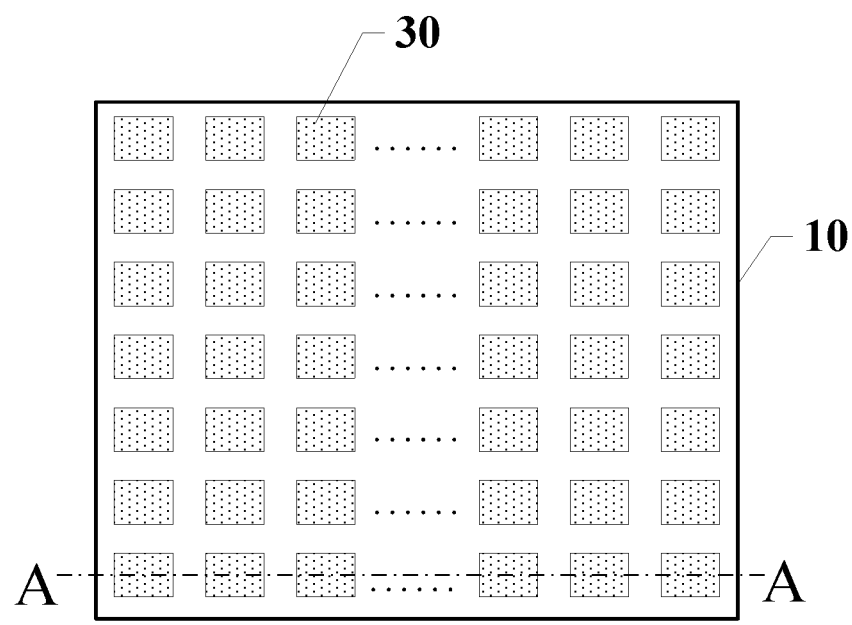
FIG. 1 illustrates a top view of a curved light-emitting substrate according to various embodiments of the present disclosure.

Various exemplary embodiments of the present disclosure are be described in detail with reference to the accompanying drawings. It should be noted that unless specifically stated otherwise, the relative arrangement of components and steps, numerical expressions and numerical values described in these embodiments may not limit the scope of the present disclosure.

The following description of at least one exemplary embodiment may be merely illustrative and may not be used to limit the present disclosure and its application or use.

The technologies, methods, and apparatuses known to those skilled in the art may not be discussed in detail, but where appropriate, the technologies, methods, and apparatuses should be regarded as a part of the present disclosure.

In all examples shown and discussed herein, any specific value should be interpreted as merely exemplary, rather than as a limitation. Therefore, other examples of the exemplary embodiment may have different values.

It should be noted that similar reference numerals and letters indicate similar items in the following drawings. Therefore, once an item is defined in one drawing, it does not need to be further discussed in the subsequent drawings.

Figure 2:
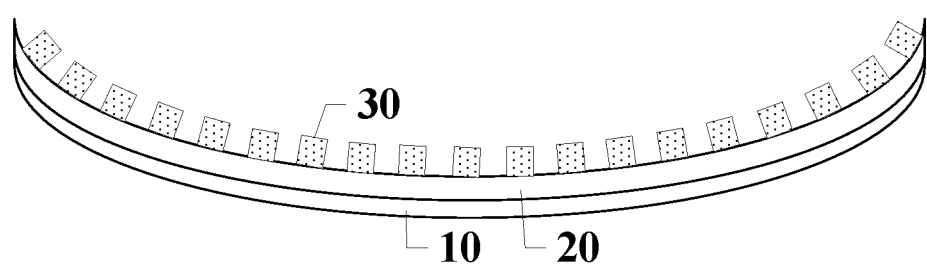
FIG. 2 illustrates a cross-sectional view of a curved light-emitting substrate along a A-A' direction in FIG. 1.
Figure 3:
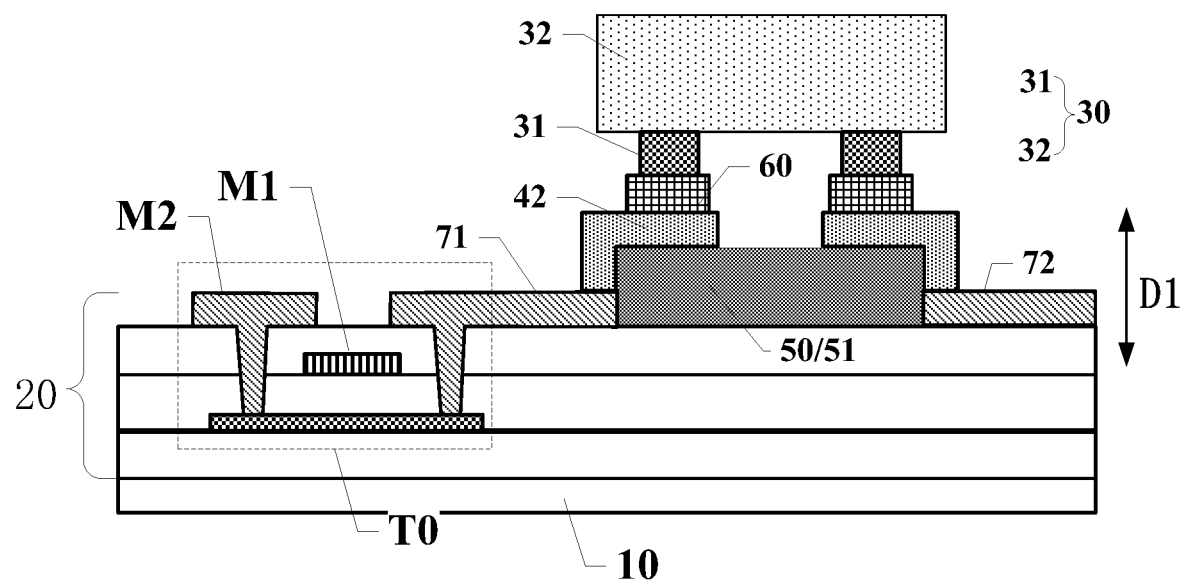
FIG. 3 illustrates a relative positional relationship between a single light-emitting element and an array layer.

FIG. 1 illustrates a top view of a curved light-emitting substrate according to various embodiments of the present disclosure; FIG. 2 illustrates a cross-sectional view of the curved light-emitting substrate along a A-A' direction in FIG. 1; and FIG. 3 illustrates a relative positional relationship between a single light-emitting element and an array layer. Referring to FIGS. 1-3, various embodiments of the present disclosure provide a curved light-emitting substrate 100. The curved light-emitting substrate 100 may include a substrate 10, an array layer 20 disposed on the side of the substrate 10, and a light-emitting element 30 electrically connected to the array layer 20. The light-emitting element 30 may include a light-emitting main body 32 and a first soldering pad 31 on the side of the light-emitting main body 32 facing the array layer 20. The curved light-emitting substrate may further include a second soldering pad 42. The second soldering pad 42 may be on the side of the array layer 20 facing the light-emitting element 30; and the second soldering pad 42 may be electrically connected to the first soldering pad 31.

The curved light-emitting substrate may further include a flexible padding layer 50. The flexible padding layer 50 may be between the light-emitting main body 32 and the array layer 20 along the first direction D1, where the first direction D1 may be perpendicular to a surface of the array layer 20.

It can be understood that the top-view structure of the curved light-emitting substrate as a rectangle may be merely taken as example in FIG. 1 to illustrate the curved light-emitting substrate of the present disclosure, which may not limit the actual shape of the curved light-emitting substrate. In some other embodiments of the present disclosure, the shape of the top-view structure of the curved light-emitting substrate may also be embodied in a rounded rectangle, a circle, an ellipse, or a special shape including an arc-shaped structure, which may not be limited according to embodiments of the present disclosure. FIG. 2 may only illustrate a curved shape of the curved light-emitting substrate in FIG. 1. In some other embodiments of the present disclosure, the curved light-emitting substrate may also be embodied in other curved shapes. FIG. 2 may only illustrate the substrate 10, the array layer 20, and the light-emitting element 30, and may not illustrate the actual film layer structure of the array layer 20 and detailed connection relationship between the light-emitting element 30 and the array layer 20. FIG. 3 may exemplarily illustrate a part of the film layer structure of the array layer 20, which may not indicate the number and thicknesses of film layers actually included in the array layer 20. In addition, it can be understood that FIG. 3 may only illustrate a relative positional relationship between one light-emitting element 30 and the array layer 20 and may illustrate that the array layer 20 is in a flat state rather than a curved state. In practice, when the light-emitting element 30 is at a curved region of the curved light-emitting substrate, the array layer 20 may have a certain curvature. FIG. 3 may only illustrate a single light-emitting element 30 and the array layer 20 from a macroscopic perspective.

For example, referring to FIGS. 1-3, the curved light-emitting substrate provided in embodiments of the present disclosure may include the substrate 10, the array layer 20 disposed on the side of the substrate 10, and the light-emitting element 30 electrically connected to the array layer 20. Optionally, the substrate 10 may be a rigid substrate 10. For example, the substrate 10 may be made of a material including glass or fiberglass.

In embodiment of the present disclosure, the light-emitting element 30 may include the light-emitting main body 32 and the first soldering pad 31 on the light-emitting main body 32 facing the array layer 20; the second soldering pad 42 may be disposed on the side of the array layer 20 facing the light-emitting element 30; and the first soldering pad 31 and the second soldering pad 42 may be electrically connected with each other. Optionally, the second soldering pad 42 may be electrically connected to a signal line on the array layer 20, such that an electrical signal transmitted on the signal line may be transmitted to the light-emitting element 30 through the second soldering pad 42, and the light-emitting element 30 may emit light using the electrical signal provided by the array layer 20.

In the existing technology, when the rigid substrate is bent, the soldering pads disposed on the rigid substrate and the light-emitting elements electrically connected to the soldering pads may be deformed accordingly to generate bending stress. Under the action of the bending stress, the soldering pads of the light-emitting elements and the soldering pads on the rigid substrate may be connected by a process such as punching or binding where the force at corresponding connecting portions may be weaker than the force between other adjacent film layers. Therefore, the connection reliability between the soldering pads of the light-emitting elements and the soldering pads on the rigid substrate may be affected, which may cause the light-emitting elements to be loosen or detached, thereby affecting the light-emitting reliability of the light-emitting substrate.

To solve above-mentioned problems in the existing technology, various embodiments of the present disclosure provide the flexible padding layer 50 into the curved light-emitting substrate. For example, the flexible padding layer 50 may be disposed between the light-emitting main body 32 of the light-emitting element 30 and the array layer 20. The flexible padding layer 50 may be between the second soldering pad 42 and the array layer 20 as an example for illustration in FIG. 3. When the curved light-emitting substrate is bent, the bending stress on the substrate 10 may be transmitted to the array layer 20, and then transmitted from the array layer 20 to the side of the array layer 20 facing the light-emitting element 30. When the flexible padding layer 50 is on the side of the array layer 20 facing the light-emitting element 30, compared with other materials located on the side of the array layer 20 facing the light-emitting element, the flexible padding layer 50 may be made of a relatively flexible material. Therefore, for the bending stress transmitted to the side of the array layer 20 facing the light-emitting element, a large fraction of the stress may be transmitted to the flexible padding layer 50, and only a small fraction of the stress may act on the side of the array layer 20 where the flexible padding layer 50 is not provided. In such way, the bending stress further transmitted to the second soldering pad 42 and the light-emitting element 30 may be further reduced. Therefore, the magnitude of the bending stress on the light-emitting element 30 and the second soldering pad 42 may be effectively reduced, thereby reducing the detaching risk of the light-emitting element 30 due to the bending stress and being beneficial for improving the light-emitting reliability of the curved light-emitting substrate.

Figure 4:
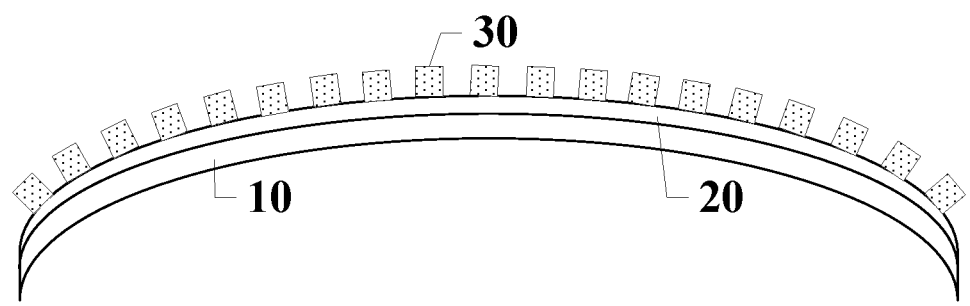
FIG. 4 illustrates another cross-sectional view of a curved light-emitting substrate along a A-A' direction in FIG. 1.

It should be noted that FIG. 2 only illustrates one embodiment that the curved light-emitting substrate is bent along the direction from the substrate 10 to the light-emitting element 30, that is, the bending axis is located on the side of the light-emitting element 30 away from the substrate 10. In some other embodiments of the present disclosure, the bending direction of the curved light-emitting substrate may also be opposite to the bending direction in FIG. 2. For example, referring to FIG. 4, the bending axis may also be located on the side of the substrate 10 away from the light-emitting element 30. For such two curved light-emitting substrates, the flexible padding layers may release the bending stress to a certain extent. FIG. 4 illustrates another cross-sectional view of the curved light-emitting substrate along a A-A' direction in FIG. 1.

The curved light-emitting substrate provided in embodiments of the present disclosure may be embodied as, for example, a curved display panel, and may also be embodied as a curved backlight module in a liquid crystal display apparatus where the light source of the backlight module is a direct-lit type backlight.

Referring to FIG. 3, in an optional embodiment of the present disclosure, the elastic modulus of the flexible padding layer 50 may be less than the elastic modulus of the substrate 10 and less than the elastic modulus of each of the first soldering pad 31 and the second soldering pad 42. The elastic modulus may be regarded as an index to measure the ease of elastic deformation of a material. The greater the elastic modulus is, the greater the stress required for a certain elastic deformation of the material is, that is, the greater the stiffness of the material is, and the smaller the elastic deformation occurs under a certain stress. On the contrary, the smaller the elastic modulus is, the smaller the stress required for a certain elastic deformation of the material is, that is, the smaller the stiffness of the material is, and the greater the elastic deformation occurs under a certain stress.

When the flexible padding layer 50 is provided in embodiments of the present disclosure, the elastic modulus of the flexible padding layer 50 may be configured to be less than the elastic modulus of the substrate 10 and the elastic modulus of each of the first soldering pad 31 and the second soldering pad 42. If the curved light-emitting substrate is bent, taking one embodiment shown in FIG. 3 that the flexible padding layer 50 is on the side of the array layer 20 facing the light-emitting element as an example, when the bending stress is transmitted from the substrate 10 to the array layer 20 and further transmitted to the side of the array layer 20 facing the light-emitting element, the bending stress may be more transmitted to the film layer with a relatively small elastic modulus on the side of the array layer 20 facing the light-emitting element, that is, the bending stress may act more on the flexible padding layer 50 with a relatively small elastic modulus. The total magnitude of the bending stress applied to the side of the array layer 20 facing the light-emitting element is fixed, such that for such bending stress, after a large fraction of the bending stress is transmitted to the flexible padding layer 50, the bending stress acting on the portion of the array layer 20 facing the light-emitting element where the flexible padding layer 50 is not provided may be relatively small. Therefore, less bending stress may be transmitted from the side of the array layer 20 facing the light-emitting element to the second soldering pad 42 of the flexible padding layer 50 on the side away from the substrate 10 and the light-emitting element 30, which may be more beneficial for reducing loosening or detaching possibility of the light-emitting element 30 under the influence of the bending stress, improving the fixing reliability and electrical connection reliability between the light-emitting element 30 and the array layer 20 in the curved light-emitting substrate, and further improving the light-emitting reliability of the curved light-emitting substrate.

Figure 5:
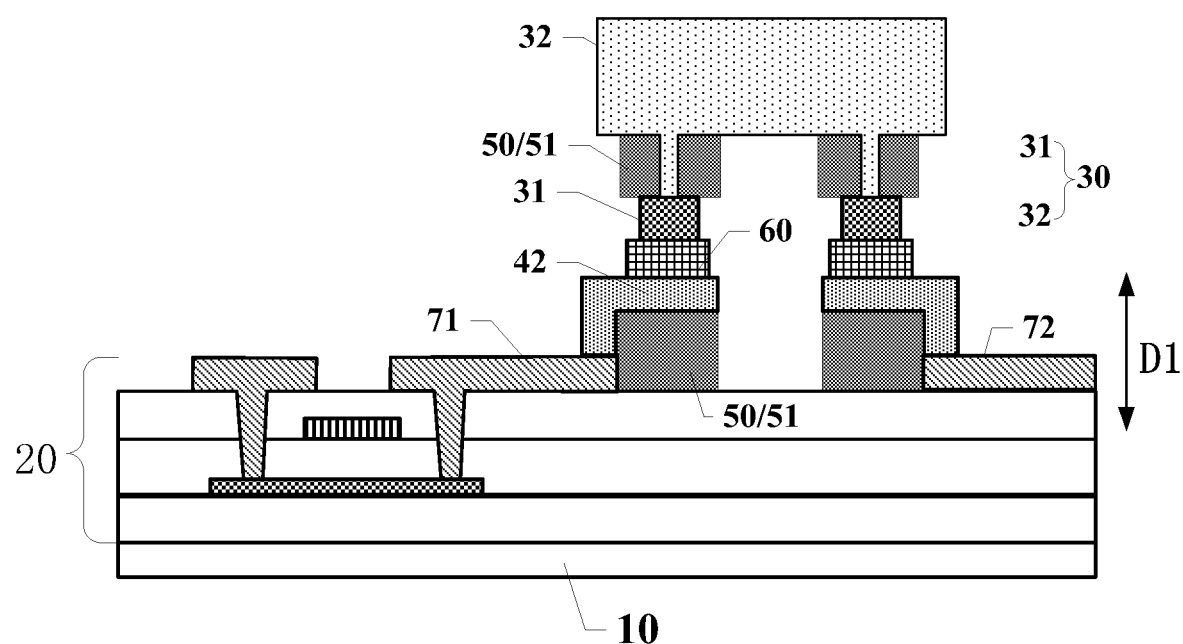
FIG. 5 illustrates another relative positional relationship between a single light-emitting element and an array layer.

FIG. 5 illustrates another relative positional relationship between a single light-emitting element 30 and an array layer 20. FIG. 5 exemplarily illustrates the solution that two flexible padding layers 50 may be disposed in the curved light-emitting substrate, where one padding layer may be between the light-emitting main body 32 and the first soldering pad 31, and the other padding layer may be located between the second soldering pad 42 and the array layer 20.

Referring to FIG. 3 and FIG. 5, in an optional embodiment of the present disclosure, along the first direction D1, the flexible padding layer 50 may be between the second soldering pad 42 and the array layer 20, and/or the flexible padding layer 50 may be between the light-emitting main body 32 and the first soldering pad 31.

For example, referring to FIG. 3, the flexible padding layer 50 may be disposed between the array layer 20 and the second soldering pad 42. When the curved light-emitting substrate is bent, a large fraction of the bending stress transmitted to the side of the array layer 20 facing the light-emitting element 30 may act on the flexible padding layer 50 between the array layer 20 and the second soldering pad 42, and the bending stress may be released by the flexible padding layer 50. In such way, the bending stress on the light-emitting element 30 and the second soldering pad 42 may be greatly reduced, and unreliable electrical connection between the second soldering pad 42 and the first soldering pad 31 when a relatively large bending stress acts on the second soldering pad 42 may be avoided. Therefore, it is beneficial for improving the fixing reliability and electrical connection reliability between the light-emitting element 30 and the array layer 20. It can be understood that when the flexible padding layer 50 is between the array layer 20 and the second soldering pad 42, after the array layer 20 is formed, the flexible padding layer 50 may need to be formed first, and then the second soldering pad 42 may be formed.

Referring to FIG. 5, the flexible padding layers 50 may be disposed between the light-emitting main body 32 of the light-emitting element 30 and the first soldering pad 31 and between the array layer 20 and the second soldering pad 42. As mentioned above, when the flexible padding layer 50 is disposed between the array layer 20 and the second soldering pad 42, a large fraction of the bending stress transmitted to the side of the array layer 20 facing the light-emitting element may act on such flexible padding layer 50, and only a small fraction of the bending stress may remain on the side of the array layer 20 facing the light-emitting element that is not provided with the flexible padding layer 50. When such small fraction of the bending stress is further transmitted toward the direction of the light-emitting element 30, the bending stress transmitted to the second soldering pad 42 and the first soldering pad 31 may be relatively small. In the present disclosure, when the flexible padding layer 50 is further disposed between the light-emitting main body 32 and the first soldering pad 31, the bending stress transmitted from the second soldering pad 42 to the first soldering pad 31 may be released through such flexible padding layer 50, such that the bending stress actually acting on the first soldering pad 31 and the second soldering pad 42 may be further reduced. Therefore, it is beneficial for avoiding that the light-emitting element 30 is detached from the array layer 20 due to the action of the bending stress or the connection reliability of the first soldering pad 31 and the second soldering pad 42 is reduced, thereby being further beneficial for improving the fixing reliability and electrical connection reliability between the light-emitting element 30 and the array layer 20.

It can be understood that, in the light-emitting element 30, the light-emitting main body 32 may be electrically connected to the first soldering pad 31. When the flexible padding layer 50 is disposed between the light-emitting main body 32 and the first soldering pad 31, the electrical connection between the first soldering pad 31 and the light-emitting main body 32 may be realized by a manner of forming a via in the flexible padding layer 50, which may not be limited according to various embodiments of the present disclosure.

Figure 6:
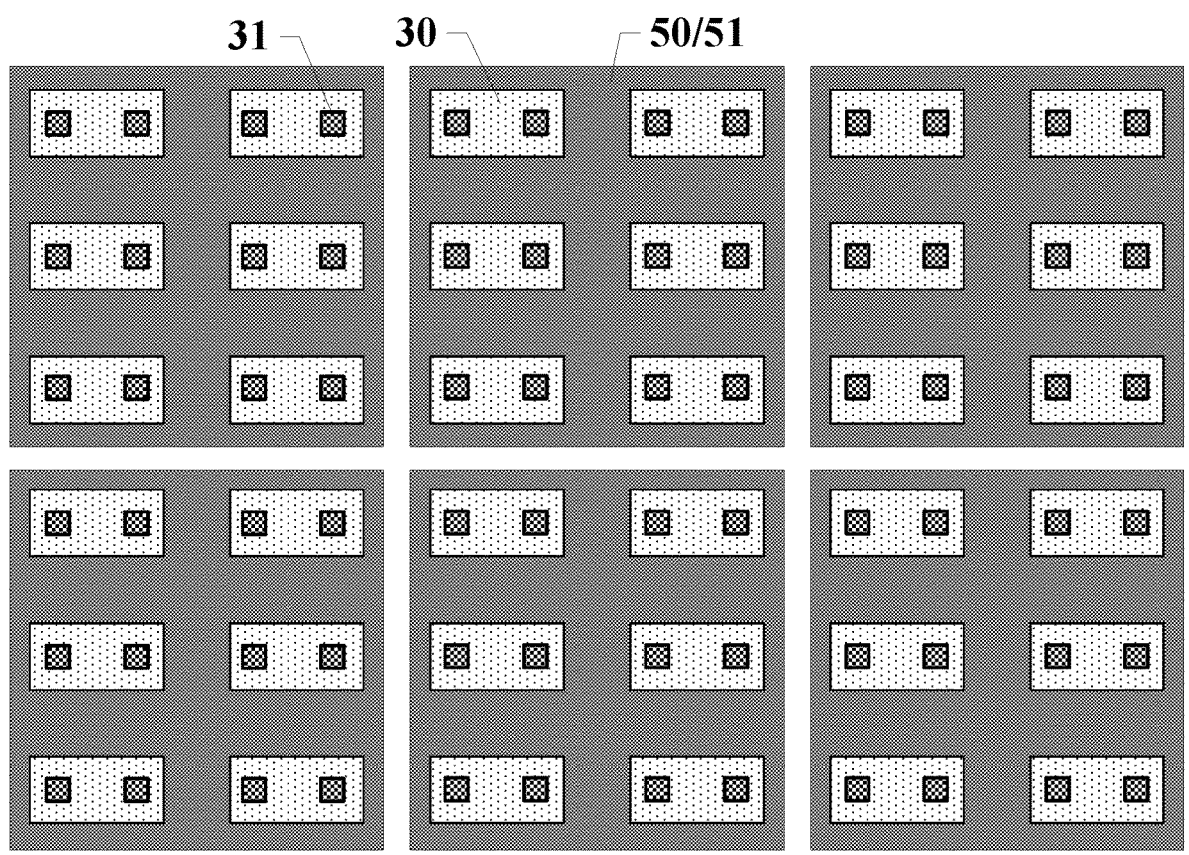
FIG. 6 illustrates a top view showing a relative positional relationship between a flexible padding layer and a light-emitting element.

FIG. 6 illustrates a top view showing a relative positional relationship between the flexible padding layer 50 and the light-emitting element 30. The solution that the flexible padding layer 50 includes a plurality of flexible pads 51, and a same flexible pad 51 corresponds to a plurality of light-emitting elements 30 may be illustrated in one embodiment. The film layer correspondence between a same light-emitting element, the array layer and the flexible padding layer in one embodiment shown in FIG. 6 may refer to the structure in FIG. 3 or FIG. 5.

Referring to FIG. 6, in conjunction with FIG. 3 and FIG. 5, in an optional embodiment of the present disclosure, the flexible padding layer 50 may include the plurality of flexible pads 51; the plurality of flexible pads 51 may not be connected with each other; and along the first direction D1, the flexible pad 51 may overlap the first soldering pad 31.

For example, in the curved light-emitting substrate provided in embodiments of the present disclosure, the flexible padding layer 50 may include the plurality of flexible pads 51 that are not connected with each other. For example, a same flexible pad 51 may correspond to a plurality of light-emitting elements 30. That is, the orthographic projections of the plurality of light-emitting elements 30 on the substrate may overlap the orthographic projection of the same flexible pad 51 on the substrate. In such way, when the curved light-emitting substrate is bent and the bending stress is transmitted to the side of the array layer facing the light-emitting element 30, the flexible pad 51 may be disposed between the second soldering pad 42 and the array layer 20, and the second soldering pad 42 and the array layer 20 may be overlapped with each other along the first direction D1. Therefore, in the bending stress originally acting directly on the second soldering pad 42, a large fraction of such bending stress may first act on the flexible padding layer 50 on the side of the array layer 20 facing the light-emitting element and the bending stress further transmitted from the flexible padding layer 50 to the second soldering pad 42 may be significantly small. In such way, the phenomenon of unreliable connection between the light-emitting element 30 and the second soldering pad 42 due to the bending stress acting on the second soldering pad 42 may be greatly reduced. In addition, in embodiments of the present disclosure, the plurality of flexible pads 51 that are not connected with each other may be disposed, and the flexible pads 51 corresponding to the second soldering pads 42 in different regions may release the bending stresses in respective regions, which may be beneficial for increasing the stress release speed and further beneficial for reducing the phenomenon that the bending stresses in different regions may interact with each other to affect reliable stress transmission (e.g., the magnitude of the bending stress transmitted from the side of the array layer 20 facing the light-emitting element to the flexible padding layer 50 may be affected).

Figure 7:
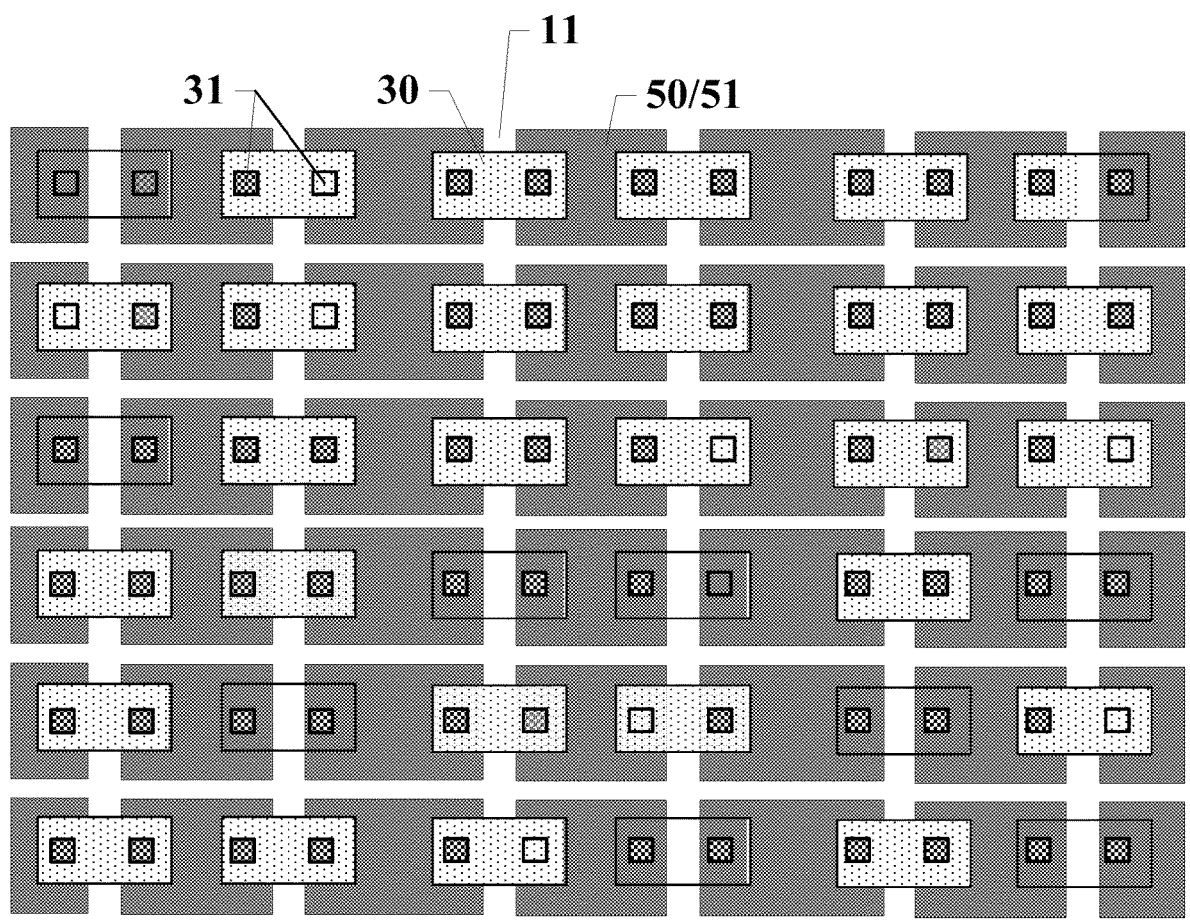
FIG. 7 illustrates another top view showing a relative positional relationship between a flexible padding layer and a light-emitting element.
Figure 8:
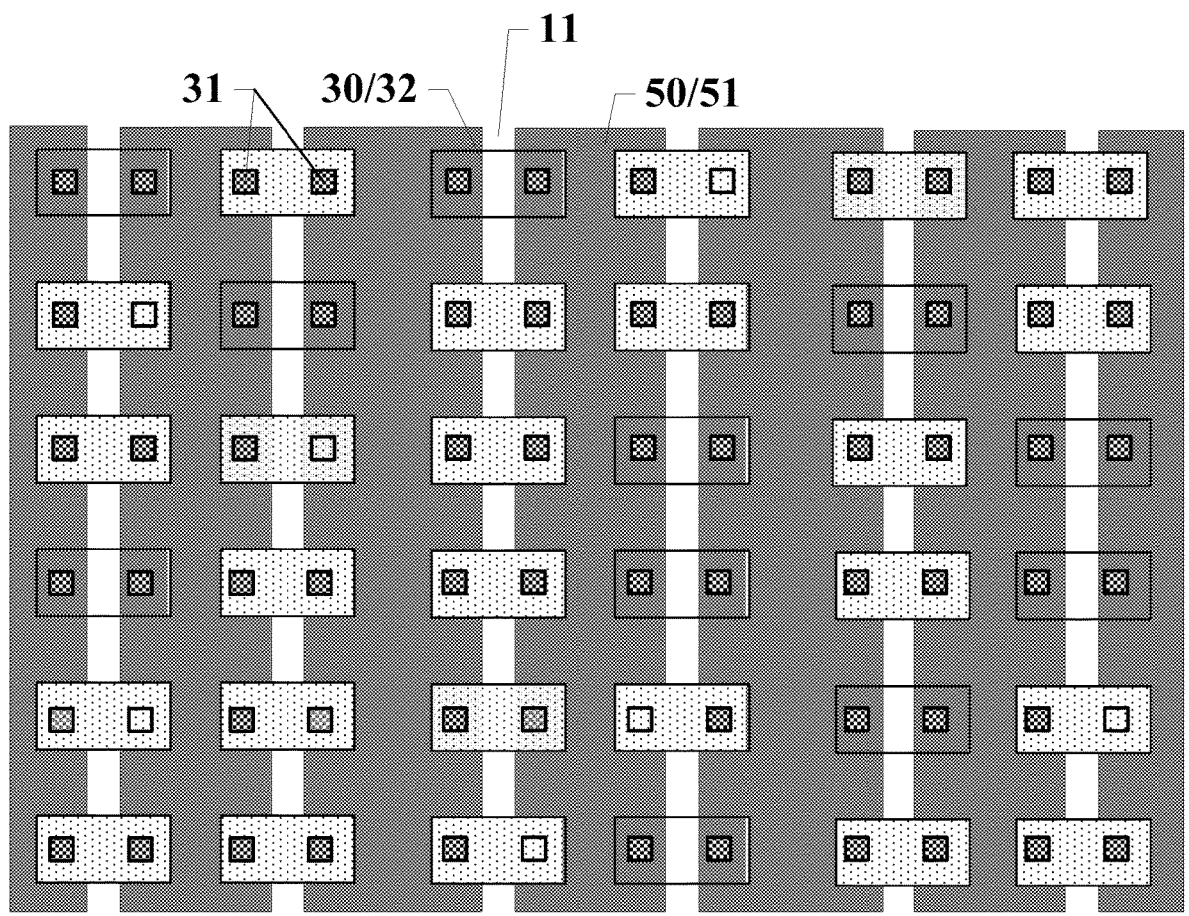
FIG. 8 illustrates another top view showing a relative positional relationship between a flexible padding layer and a light-emitting element.
Figure 9:
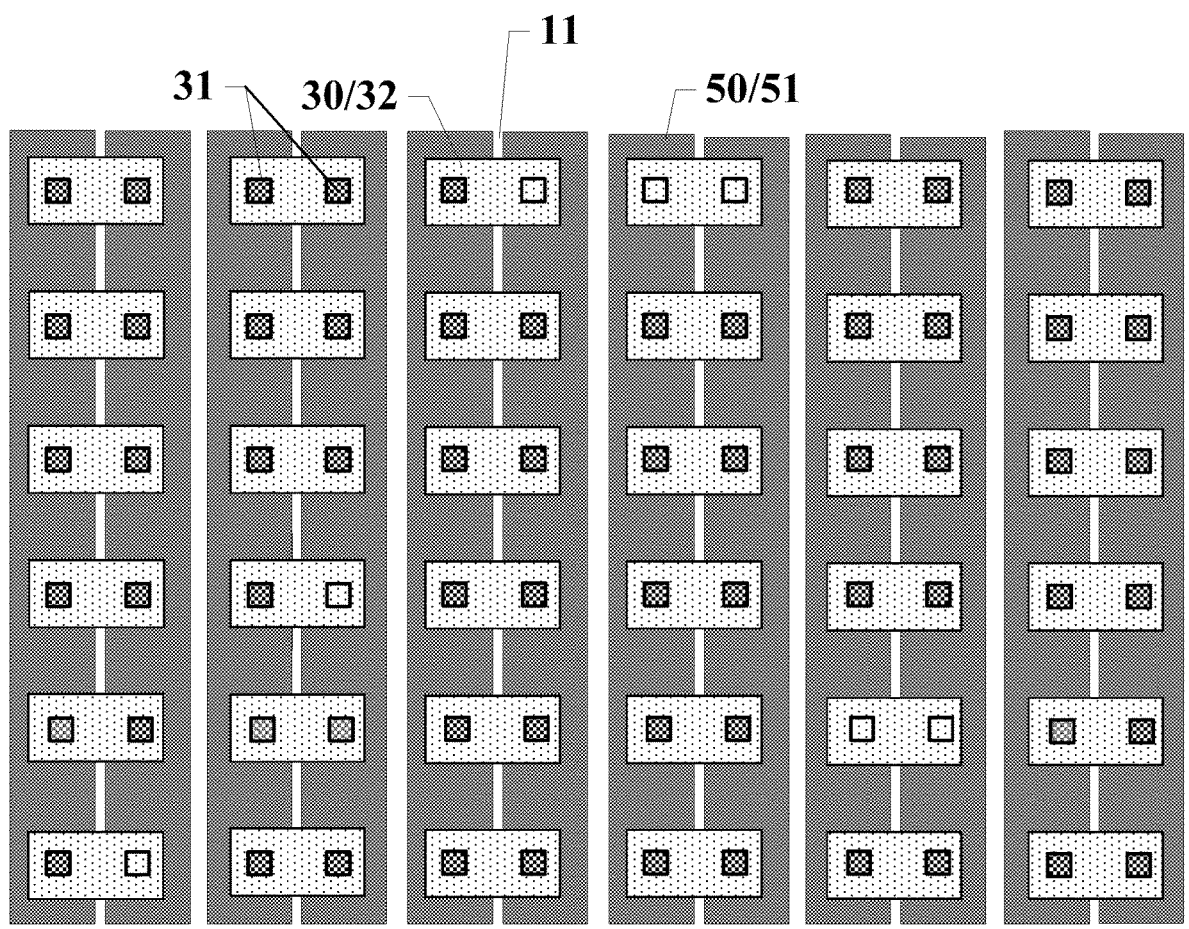
FIG. 9 illustrates another top view showing a relative positional relationship between a flexible padding layer and a light-emitting element.
Figure 10:
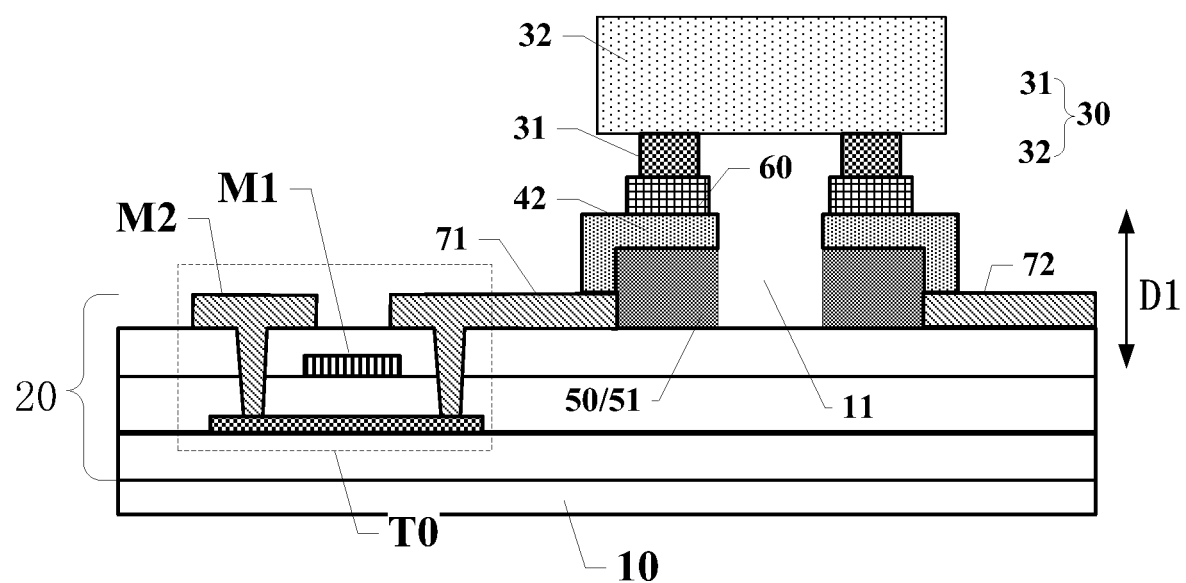
FIG. 10 illustrates another relative positional relationship between a single light-emitting element and an array layer.

FIGS. 7, 8, and 9 respectively illustrate another top view showing a relative positional relationship between the flexible padding layer 50 and the light-emitting element 30. Such embodiments illustrate solutions that disconnected positions of two adjacent flexible pads 51 may overlap the orthographic projections of the light-emitting elements 30 on the substrate. The similarity of such three embodiments is that, along the direction perpendicular to the plane of the flexible padding layer 50, at least a part of the first spacings 11 that the first spacing is between two adjacent flexible pads 51 may overlap the light-emitting main bodies 32. The film layer structure may refer to FIG. 10, and FIG. 10 illustrates another relative positional relationship between a single light-emitting element and an array layer. The difference between FIGS. 7, 8 and 9 is that the numbers of the flexible pads 51 included in the flexible padding layer 50 may be different. The number of the flexible pads 51 included in the flexible padding layer 50 in FIG. 7 is the largest, the number of the flexible pads 51 included in the flexible padding layer 50 in FIG. 8 is the least, and the number of the flexible pads 51 included in the flexible padding layer 50 in FIG. 9 is the medium. The more the number of the flexible pads 51 is, the more it is beneficial for avoiding mutual transmission and interaction of the bending stress, therefore, the more it is beneficial for rapid release of the bending stress.

Referring to FIGS. 7-10, in an optional embodiment of the present disclosure, in at least a part of the flexible pads 51, a first spacing 11 may be included between two adjacent flexible pads 51, and the orthographic projection of the first spacing 11 on the substrate 10 may overlap the orthographic projection of the light-emitting main body 32 on the substrate 10.

Optionally, in embodiments of the present disclosure, the light-emitting element 30 is illustrated by taking a solution that a same light-emitting element 30 includes two first soldering pads 31 as an example. In the existing technology, when the curved light-emitting substrate is bent, the second soldering pads corresponding to two first soldering pads in a same light-emitting element may be respectively affected by the bending stress, which may affect connection reliability between the first soldering pad and the second soldering pad. In the present disclosure, the first spacing 11 between two adjacent flexible pads 51 may be configured to be overlapped with the orthographic projection of the light-emitting main body 32 on the substrate, such that a large fraction of the bending stress that originally act on the first soldering pad 31 and the second soldering pad 42 may be transmitted to the flexible pad 51, thereby reducing the bending stress on the second soldering pad 42 and the light-emitting element 30. When the first spacing 11 between two adjacent flexible pads 51 is configured to be overlapped with the light-emitting main body 32, the first spacing 11 may cut off the stress interaction path between the flexible pads 51 corresponding to the same light-emitting element 30, which may be beneficial for avoiding the mutual transmission and interaction of the bending stress between the soldering pads and for the stress transmission from the side of the array layer 20 facing the light-emitting element to the flexible padding layer, and may be more beneficial for reducing the bending stress transmitted to the second soldering pad 42 and the light-emitting element 30.

Figure 11:
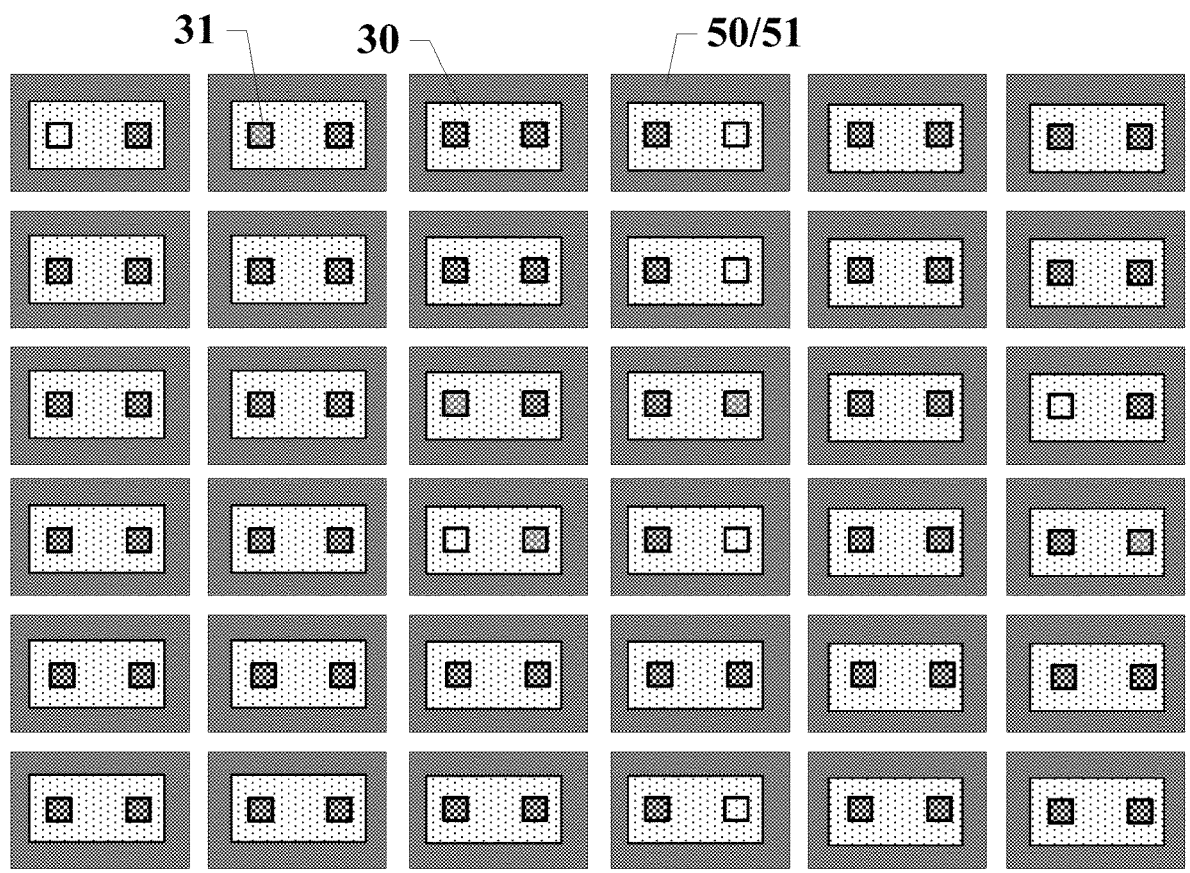
FIG. 11 illustrates another top view showing a relative positional relationship between a flexible padding layer and a light-emitting element.

FIG. 11 illustrates another top view showing a relative positional relationship between the flexible padding layer 50 and the light-emitting element 30. In one embodiment, it describes that the flexible pads 51 may be arranged in a one-to-one correspondence with the light-emitting elements 30 when the flexible padding layer 50 includes the plurality of flexible pads 51.

Referring to FIGS. 3-5 and 11, in an optional embodiment of the present disclosure, the flexible pads 51 may be arranged in a one-to-one correspondence with the light-emitting elements 30, and the orthographic projection of the first soldering pad 31 in a same light-emitting element 30 on the substrate 10 may be within the orthographic projection of the flexible pad 51 on the substrate 10.

For example, when the flexible padding layer 50 in embodiments of the present disclosure includes the plurality of flexible pads 51, the number of the flexible pads 51 may be configured according to the number of the light-emitting elements 30. That is, the light-emitting elements 30 may be arranged in a one-to-one correspondence with the flexible pads 51. The projection relationship on the substrate 10 is embodied in that the orthographic projections of the first soldering pads 31 in a same light-emitting element 30 on the substrate 10 may be within the orthographic projection of a same flexible pad 51 on the substrate 10. When the curved light-emitting substrate is bent, the flexible pad 51 corresponding to each light-emitting element 30 may release the bending stress that is originally applied to the first soldering pad 31 of the light-emitting element 30 and the second soldering pad 42 which is electrically connected to the first soldering pad 31, such that the stress actually acting on the first soldering pad 31 of the light-emitting element 30 and the second soldering pad 42 electrically connected to the first soldering pad 31 may be reduced, which may be beneficial for improving the reliability of the electrical connection between the light-emitting element 30 and the array layer 20. In addition, the solution that each light-emitting element corresponds to a flexible padding layer and different light-emitting elements correspond to different flexible padding layers may avoid that the bending stress transmitted to the flexible padding layers corresponding to different light-emitting elements may interact with each other and affect the reliable transmission and release of the bending stress.

Figure 12:
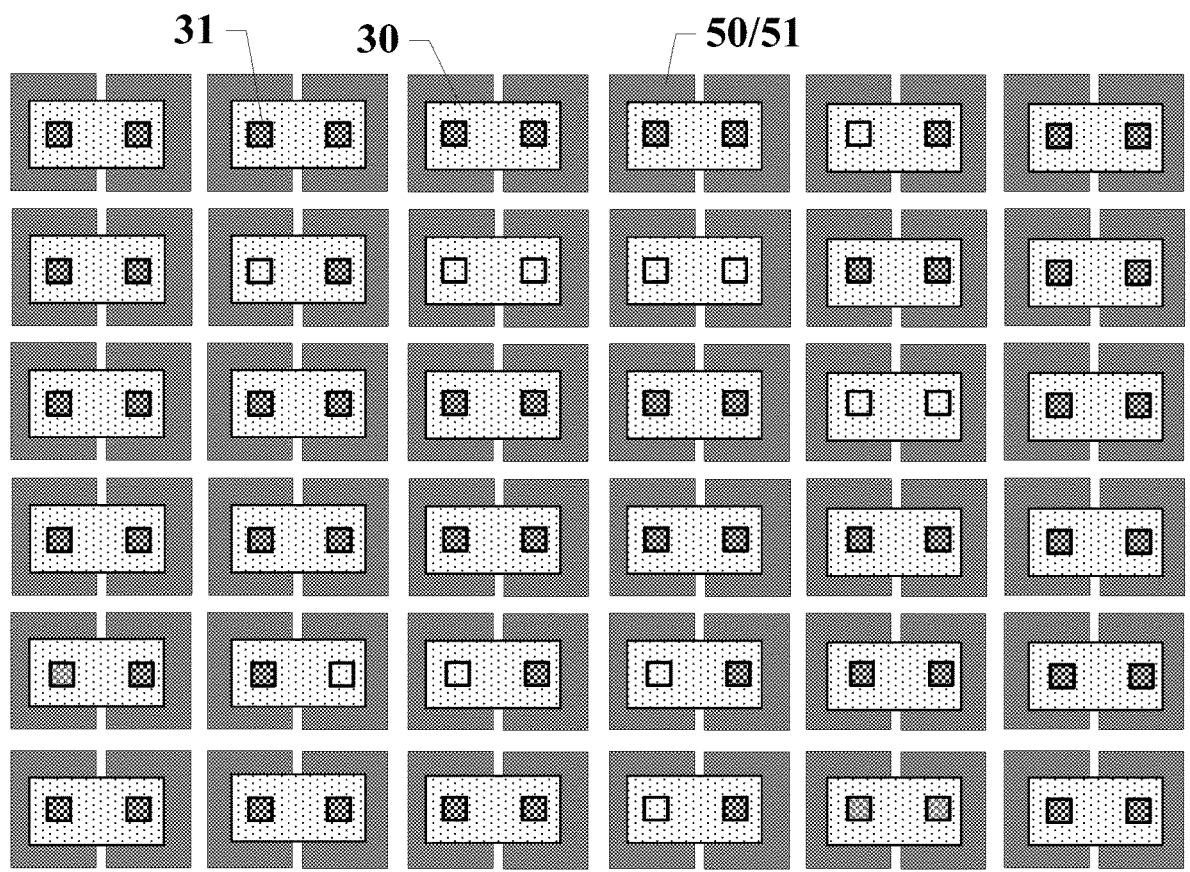
FIG. 12 illustrates another top view showing a relative positional relationship between a flexible padding layer and a light-emitting element.

FIG. 12 illustrates another top view showing a relative positional relationship between the flexible padding layer 50 and the light-emitting element 30. In one embodiment, it describes that the flexible pads 51 may be arranged in a one-to-one correspondence with the first soldering pads 31 of the light-emitting elements 30 when the flexible padding layer 50 includes the plurality of flexible pads 51.

Referring to FIG. 12, in an optional embodiment of the present disclosure, a same light-emitting element 30 may include two first soldering pads 31, and the flexible pads 51 may be arranged in a one-to-one correspondence with the first soldering pads 31. In one embodiment shown in FIG. 12, the film layer stacking relationship between the single light-emitting element 30 and the flexible pad 51 may refer to the structure in FIG. 10, and the difference may only be the magnitude of the flexible pad 51.

In the curved light-emitting substrate provided in embodiments of the present disclosure, when the flexible pads 51 and the first soldering pads 31 are arranged in a one-to-one correspondence, the flexible pads 51 may be between the second soldering pads 42 and the array layer 20 and may also be simultaneously between the second soldering pads 42 and the array layer 20 and between the light-emitting main bodies 32 of the light-emitting elements 30 and the first soldering pads 3. One embodiment shown in FIG. 12 illustrates the solution that each first soldering pad 31 of the light-emitting element 30 may correspond to one second soldering pad 42, and one flexible pad 51 may be correspondingly disposed; and each first soldering pad 31 may be electrically connected to one second soldering pad 42 in a one-to-one correspondence. That is, each first soldering pad 31 of the light-emitting element 30 and the second soldering pad 42 corresponding to the first soldering pad 31 may respectively have flexible pads 51 for releasing stress. When the curved light-emitting substrate is bent, the stress originally applied to the first soldering pad 31 and the second soldering pad 42 may be released by the flexible pads 51. In embodiments of the present disclosure, different flexible pads 51 may be respectively disposed at the positions of the first soldering pads 31 and the second soldering pads 42 which are related with each other in a one-to-one correspondence, and the stress at each soldering pad position may be released with a point-to-point manner in time, which may be beneficial for improving the release speed of the bending stress. Moreover, in embodiments of the present disclosure, different flexible pads 51 may be respectively configured for all second soldering pads 42, the flexible pads 51 corresponding to any two adjacent second soldering pads 42 may not be connected to each other. For example, there is spacing between two adjacent second soldering pads 42, and no two second soldering pads 42 may share a same flexible pad 51, such that the bending stress on the flexible pads 51 corresponding to different second soldering pads 42 may be prevented from being mutually transmitted and interacted with each other. Therefore, the bending stress transmitted to the second soldering pad 42 and the light-emitting element 30 may be reduced to the greatest extent, which may be more beneficial for improving the fixing reliability and electrical connection reliability between the light-emitting element 30 and the second soldering pad 42.

Referring to FIGS. 10 and 12, in an optional embodiment of the present disclosure, in the flexible pads 51 and the first soldering pads 31 arranged in a one-to-one correspondence, along the first direction D1, the orthographic projection of the first soldering pad 31 on the substrate 10 may be within the orthographic projection of the flexible pad 51 on the substrate 10.

In the curved light-emitting substrate provided in embodiments of the present disclosure, when the flexible pads 51 are arranged in a one-to-one correspondence with the first soldering pads 31, the flexible pad 51 may be between the light-emitting main body 32 of the light-emitting element 30 and the first soldering pad 31 and may also be between the second soldering pad 42 and the array layer 20. When the flexible pads 51 are arranged in a one-to-one correspondence with the first soldering pads 31, in embodiments of the present disclosure, the magnitude of the orthographic projection of the flexible pad 51 on the substrate 10 may be configured to be greater than the magnitude of the orthographic projection of the first soldering pad 31 on the substrate 10, and the orthographic projection of the first soldering pad 31 on the substrate 10 may be configured to be within the orthographic projection of the flexible pad 51 on the substrate 10. When the curved light-emitting substrate is bent, the magnitude of the flexible pad 51 is greater than the magnitude of the first soldering pad 31, such that the flexible pad 51 may release the stress that acts on the first soldering pad 31 or the second soldering pad 42 as possible, and the manner that each first soldering pad 31 corresponds to one flexible pad 51 may provide an independent stress release path for each first soldering pad 31 or second soldering pad 42. While effectively releasing the bending stress on the first soldering pad 31 or the second soldering pad 42, it is also beneficial for increasing the stress release speed and reducing the time that the stress affects the first soldering pad 31 or the second soldering pad 42, thereby being more beneficial for improving the reliability of the electrical connection between the light-emitting element 30 and the array layer 20.

Figure 13:
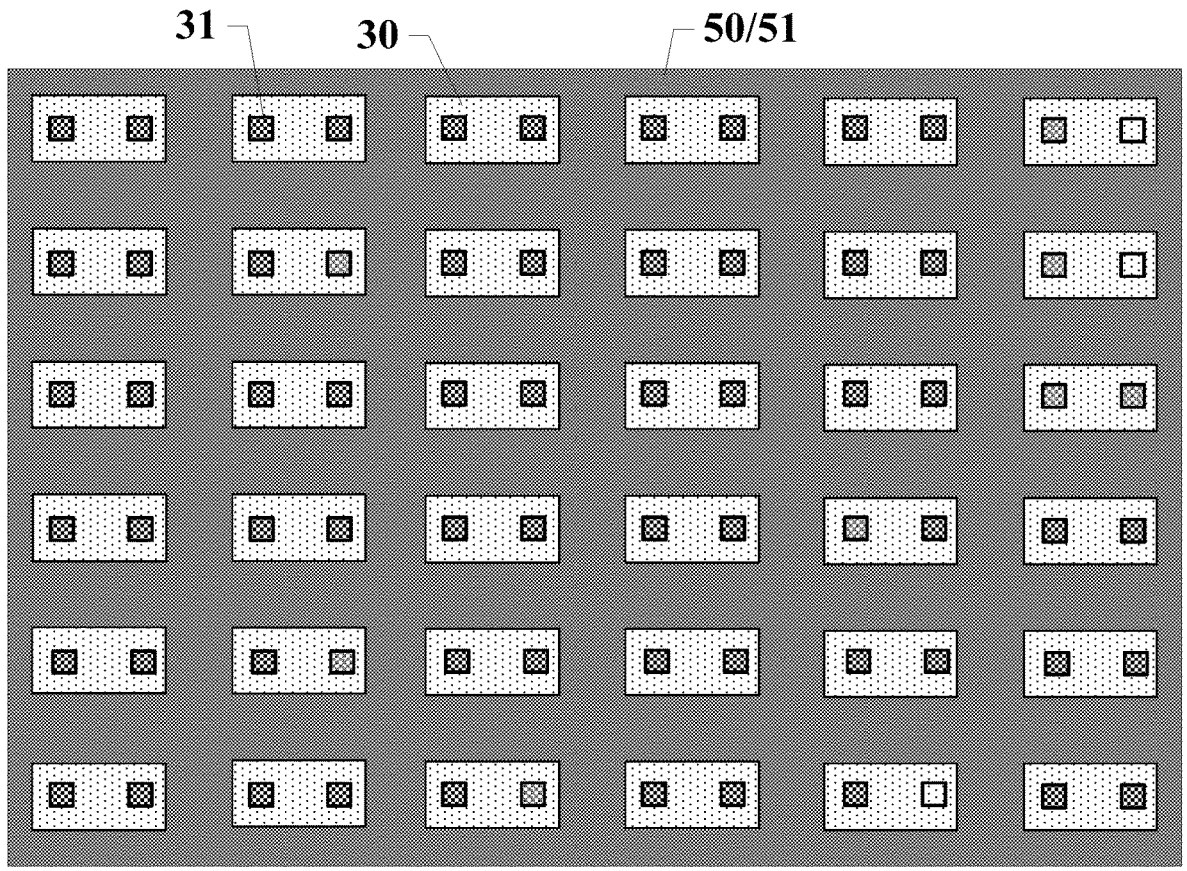
FIG. 13 illustrates a top view of a relationship between a flexible padding layer and each light-emitting element in a curved light-emitting substrate according to various embodiments of the present disclosure.
Figure 14:
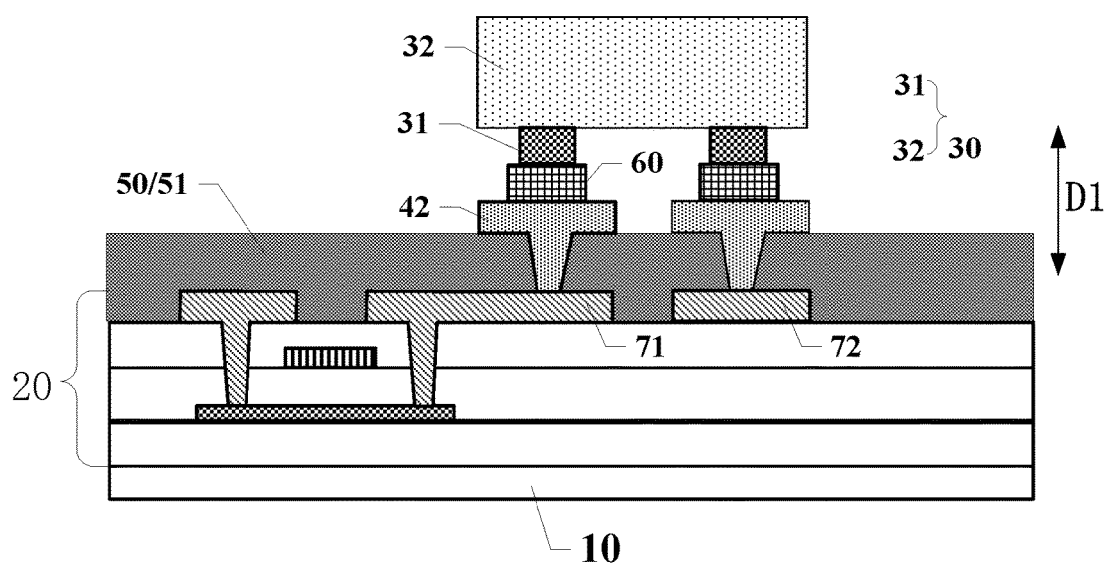
FIG. 14 illustrates a connection schematic between a second soldering pad and an array layer in a curved light-emitting substrate corresponding to FIG. 13.

FIG. 13 illustrates a top view of a relationship between the flexible padding layer 50 and each light-emitting element 30 in the curved light-emitting substrate according to various embodiments of the present disclosure. FIG. 14 illustrates a connection schematic between the second soldering pad 42 and the array layer 20 in the curved light-emitting substrate corresponding to FIG. 13.

Referring to FIGS. 13-14, in an optional embodiment of the present disclosure, the flexible padding layer 50 may be between the second soldering pad 42 and the array layer 20 along the first direction D1; the flexible padding layer 50 may include one flexible pad 51, and the orthographic projection of each first soldering pad 31 on the substrate 10 may be within the orthographic projection of the flexible pad 51 on the substrate 10; and the second soldering pad 42 may be electrically connected to the array layer 20 through a via in the flexible padding layer 50.

In one embodiment, it describes the solution that only one flexible pad 51 is disposed in the curved light-emitting substrate when the flexible padding layer 50 is between the second soldering pad 42 and the array layer 20. At this point, the orthographic projections of the first soldering pads 31 corresponding to the light-emitting elements 30 on the substrate 10 may all be within the orthographic projection of a same flexible pad 51 on the substrate 10. The light-emitting element 30 is electrically connected to the array layer 20 through the second soldering pad 42, such that when an entire-surface flexible pad 51 is disposed between the second soldering pad 42 and the array layer 20, the electrical connection between the second soldering pad 42 and the array layer 20 may be realized by a manner of forming a via in the flexible pad 51. The flexible pad 51 is disposed between the second soldering pad 42 and the array layer 20, such that when the curved light-emitting substrate is bent, the stress on the second soldering pad 42 may be released to improve the connection reliability between the light-emitting element 30 and the array layer 20, which may also be beneficial for simplifying the formation process of the flexible padding layer 50.

Figure 15:
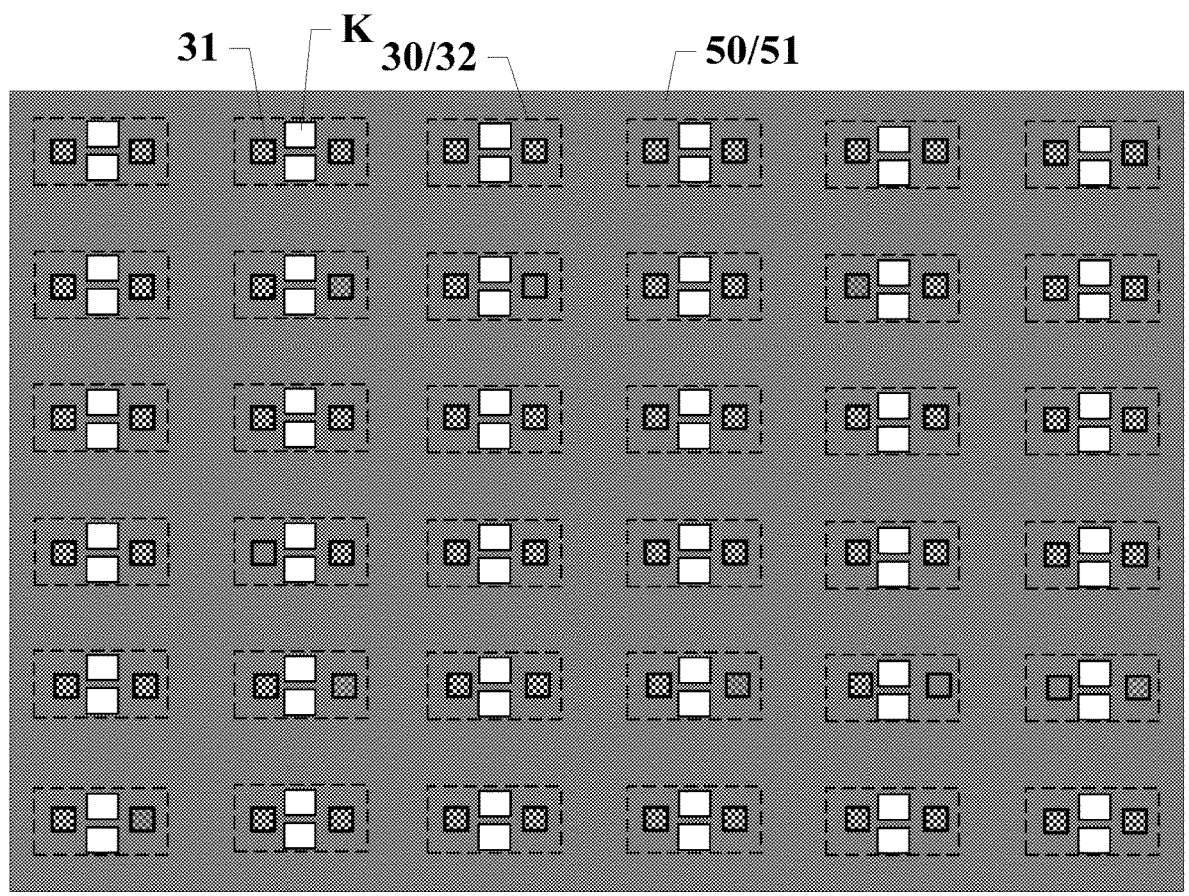
FIG. 15 illustrates a top view showing a relationship between a flexible padding layer and a first soldering pad of a light-emitting element in a curved light-emitting substrate according to various embodiments of the present disclosure.

FIG. 15 illustrates a top view showing a relationship between the flexible padding layer 50 and the first soldering pad 31 of the light-emitting element 30 in the curved light-emitting substrate according to various embodiments of the present disclosure. It can be understood that, in order to clearly illustrate the relative positional relationship between an opening structure K on the flexible pad 51 and the light-emitting main body 32 and the first soldering pad 31 in the light-emitting element 30, FIG. 15 only illustrates the light-emitting main body 32 of the light-emitting element 30 with a dashed box, that is, the position shown by the dotted box is the position corresponding to the light-emitting main body 32 of the light-emitting element 30.

Referring to FIG. 15, in an optional embodiment of the present disclosure, the flexible pad 51 may include a plurality of opening structures K; the opening structures K may pass through the flexible pad 51 along the first direction; and along the first direction, the opening structure K may overlap the light-emitting main body 32.

For example, when the flexible pad 51 has an entire-surface structure, the flexible pad 51 provided with the opening structure K may be more easily bent than the flexible pad 51 without the opening structure K. That is, the flexible pad 51 provided with the opening structure K may be more beneficial for releasing stress. In embodiments of the present disclosure, when the opening structure K is formed on the entire-surface flexible pad 51, the orthographic projection of the opening structure K to the substrate may be configured to overlap the orthographic projection of the light-emitting main body 32 to the substrate. Optionally, the opening structure K may be formed at a position corresponding to each light-emitting main body 32, so that the bending stress at the position of each light-emitting element 30 may be quickly released, which may also be beneficial for improving the fixing reliability and electrical connection reliability between the light-emitting element 30 and the array layer 20.

Figure 16:
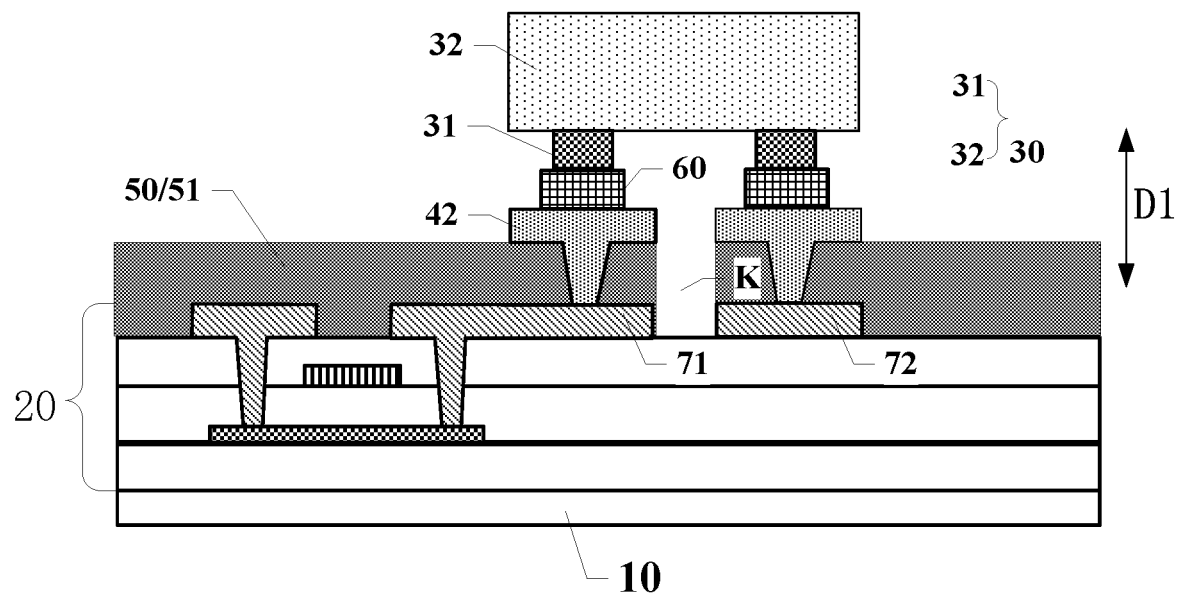
FIG. 16 illustrates another relative positional relationship between a single light-emitting element and an array layer.
Figure 17:
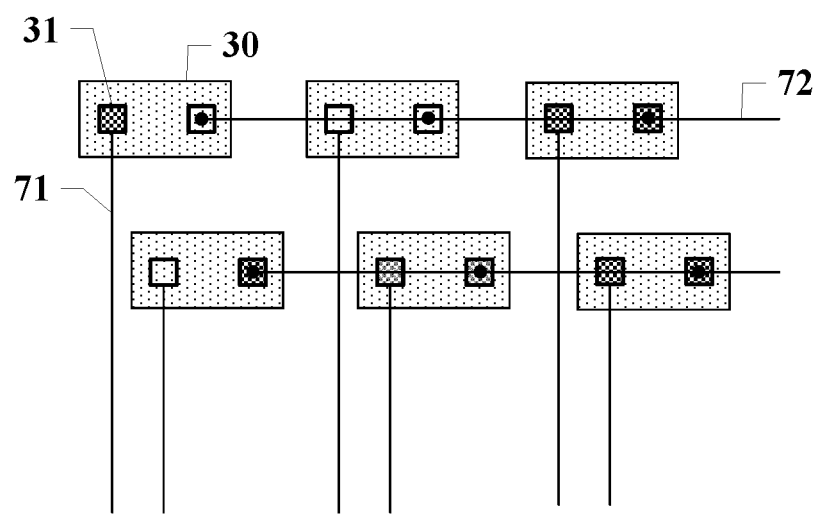
FIG. 17 illustrates a connection schematic between a light-emitting element, a first signal line, and a second signal line.

Referring to FIG. 16, in conjunction with FIG. 15, FIG. 16 illustrates another relative positional relationship between a single light-emitting element and an array layer. FIG. 16 illustrates a solution that the opening structure K is formed in the flexible padding layer 50, and the orthographic projection of the opening structure K on the substrate 10 is between two second soldering pads 42 corresponding to a same light-emitting element 30 when the entire-surface flexible padding layer 50 is disposed in the curved light-emitting substrate. In an optional embodiment of the present disclosure, the light-emitting element 30 may include two first soldering pads 31, and the orthographic projection of the opening structure K on the substrate 10 may be at least between orthographic projections of two first soldering pads 31 of the light-emitting element 30 on the substrate 10. The first soldering pad 31 of the light-emitting element 30 is configured corresponding to the second soldering pad 42, such that at this point, the orthographic projection of the opening structure K on the substrate may also be between two second soldering pads 42 corresponding to the same light-emitting element 30.

For example, in embodiments of the present disclosure, it describes the solution that two first soldering pads 31 of the light-emitting element 30 are located on a same side of the light-emitting main body 32. When the light-emitting element 30 is fixed on the array layer 20 through the second soldering pad 42 and the curved light-emitting substrate is bent, the bending stress on the first soldering pad 31 and the second soldering pad 42 of the light-emitting element 30 may be relatively large. In order to avoid or reduce the influence of the bending stress on the first soldering pads 31 and the second soldering pads 42, when the opening structures K are arranged on the flexible padding layer 50, the opening structures K may be between two first soldering pads 31 corresponding to a same light-emitting element 30. The bending stress on the first soldering pad 31 and the second soldering pad 42 may be quickly released through the flexible padding layer 50 and the opening structures K, which may be beneficial for improving the fixing reliability and electrical connection reliability of the light-emitting element 30 and the array layer 20. In addition, when the opening structure K is formed on the flexible pad 51 and when the orthographic projection of the opening structure K on the substrate 10 is between the two second soldering pads 42 corresponding to the light-emitting main body 32, the opening structure K may prevent the mutual transmission and interaction of the bending stress between two different second soldering pads 42 corresponding to the same light-emitting element 30, such that the bending stress may be transmitted reliably.

It should be noted that FIG. 15 illustrates the solution that two opening structures K are provided between two first soldering pads 31 corresponding to a same light-emitting element 30; and the number and shape of the opening structures K between two first soldering pads 31 may not be limited in the present disclosure. In some other embodiments of the present disclosure, the number of the opening structures K between two first soldering pads 31 may also be other numbers, such as one, three or more; and the shapes of the opening structures may also be embodied in other shapes than rectangles, such as circular, oval, and the like.

Figure 18:
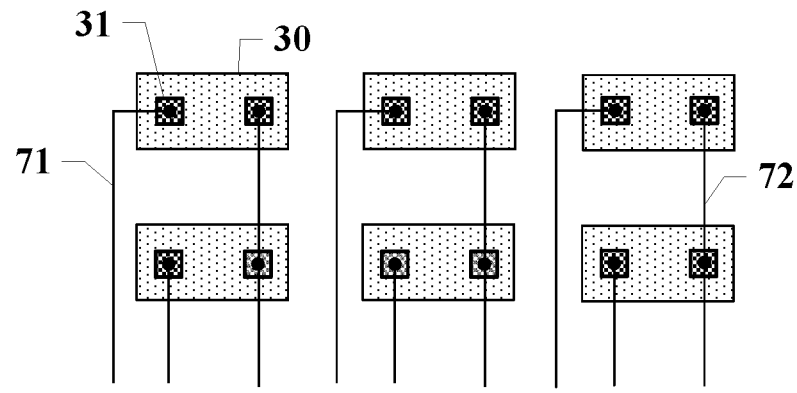
FIG. 18 illustrates another connection schematic between a light-emitting element, a first signal line, and a second signal line.

Referring to FIGS. 3, 5, 10, 14, 16, 17 and 18, FIG. 17 illustrates a connection schematic between the light-emitting element 30, the first signal line 71 and the second signal line 72; and FIG. 18 illustrates another connection schematic between the light-emitting element 30, the first signal line 71 and the second signal line 72. In an optional embodiment of the present disclosure, the array layer 20 may include the first signal line 71 and the second signal line 72; the light-emitting element 30 may include two first soldering pads 31; and two first soldering pads 31 in a same light-emitting element 30 may be electrically connected to the first signal line 71 and the second signal line 72 through different second soldering pads 42, respectively.

For example, in two first soldering pads 31 in the light-emitting element 30, one first soldering pad may be regarded as the positive electrode of the light-emitting element 30, and the other first soldering pad may be regarded as the negative electrode of the light-emitting element 30. When electrical signals are respectively supplied to two first soldering pads 31 of the light-emitting element 30, the light-emitting element 30 may be driven to emit light. Optionally, two first soldering pads 31 in a same light-emitting element 30 may be electrically connected to the first signal line 71 and the second signal line 72 in the array layer 20 through different second soldering pads 42, respectively. In such way, signals may be provided to the first soldering pads 31 in the light-emitting element 30 and the second soldering pads 42 through the first signal line 71 and the second signal line 72, respectively, thereby controlling the light-emitting element 30 to emit light.

It should be noted that the first signal line 71 and the second signal line 72 on the array layer may be arranged in a same layer or different layers. The extending directions of the first signal line 71 and the second signal line 72 on the array layer may be embodied as intersection shown in FIG. 17 or parallel shown in FIG. 18, which may not be limited according to embodiments of the present disclosure. When the first signal line 71 and the second signal line 72 are arranged in a same layer, such two lines may be embodied in a parallel relationship; and when the first signal line 71 and the second signal line are disposed in different layers, such two lines may be embodied in an intersection relationship or a parallel relationship.

Optionally, the second signal line 72 is a signal line electrically connected to the negative electrode of the light-emitting element, such that a plurality of light-emitting elements may share a same second signal line 72. For example, the light-emitting elements in a same row in FIG. 17 may be connected to a same second signal line 72, and the light-emitting elements in a same column in FIG. 18 may be connected to a same second signal line 72, which may be beneficial for reducing the total quantity of signal lines in the curved light-emitting substrate.

Referring to FIG. 10, in one embodiment, it describes a connection schematic between the second soldering pads 42 and the array layer 20 when the flexible padding layer 50 includes the plurality of flexible pads 51 which is arranged in a one-to-one correspondence with the second soldering pads 42.

In an optional embodiment of the present disclosure, along the first direction D1, the flexible padding layer 50 may be between the second soldering pad 42 and the array layer 20; the flexible padding layer 50 may include the plurality of flexible pads 51; and the second soldering pad 42 may cover the side of the flexible pad 51 away from the substrate 10 and extend from the side of the flexible pad 51 to the side of the array layer 20 facing the light-emitting element, and may be electrically connected to the first signal line 71 or the second signal line 72 on the array layer 20.

When the flexible padding layer 50 is introduced between the array substrate and the second soldering pad 42, FIG. 10 illustrates a connection manner of the second soldering pad 42 and the first signal line 71 or the second signal line 72. When forming the second soldering pad 42, the second soldering pad 42 may be extended from the side of the flexible pad 51 to the side of the array layer 20 facing the light-emitting element, such that extended second soldering pads 42 may be electrically connected to the first signal line 71 or the second signal line 72 on the side of the array layer 20 facing the light-emitting element. When the electrical connection between the second soldering pad 42 and the first signal line 71 or the second signal line 72 is realized by extending the second soldering pad 42, it is beneficial for ensuring the flatness of the second soldering pad 42 on the side of the flexible padding layer 50 away from the substrate 10; and when an intermediate medium such as solder paste is used to realize the electrical connection between the first soldering pad 31 and the second soldering pad 42, the second soldering pad 42 may provide a flat surface for the solder paste, such that it is beneficial for improving electrical connection reliability between the light-emitting element 30 and the second soldering pad 42.

When the electrical connection with the first signal line 71 or the second signal line 72 is realized by a manner of extending the second soldering pad 42, since the second soldering pad 42 is on the side of the flexible padding layer 50 away from the substrate 10, the angle between the side surface of the flexible pad 51 and the substrate may be set to 0°-90° to ensure the connection reliability between the extended portion of the second soldering pad 42 and the first signal line 71 or the second signal line 72. FIG. 10 illustrates the solution with the angle of 90°; and in some other embodiments of the present disclosure, the angle may also be set to 30°, 45°, 60°, and the like, which may not be shown one by one in the present disclosure.

Figure 19:
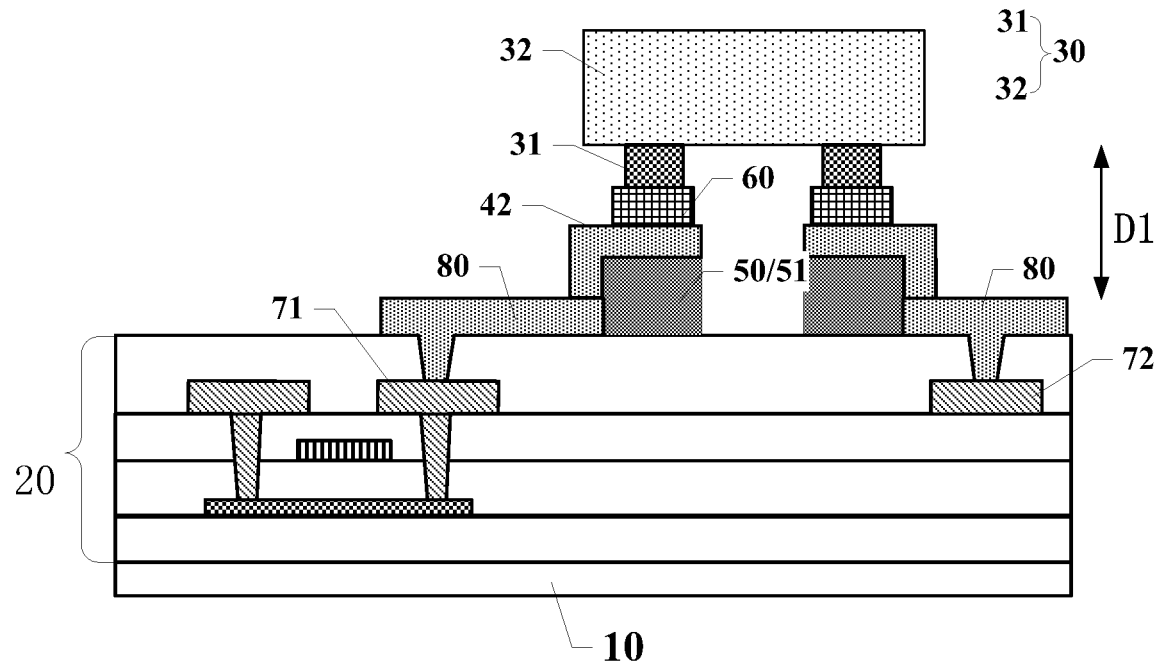
FIG. 19 illustrates a connection relationship schematic between a light-emitting element and an array layer according to various embodiments of the present disclosure.

It can be understood that, since the first signal line 71 and the second signal line 72 in the array layer 20 need to be electrically connected to the second soldering pad 42 disposed on the side of the array layer 20 away from the substrate 10, if the film layer where the first signal line 71 or the second signal line 72 is located is not on the side of the array layer 20 away from the substrate 10 (for example, refer to FIG. 19), the first signal line 71 and the second signal line 72 may be led out to the side of the array layer 20 away from the substrate 10 to facilitate the electrical connection between the second soldering pad 42 and the first signal line 71 or the second signal line 72. That is, conductive pads 80 electrically connected to the first signal line 71 and the second signal line 72 may be formed on the side of the array layer 20 facing the light-emitting element. Optionally, the conductive pad 80 may be electrically connected to the first signal line 71 or the second signal line 72 through a via. FIG. 19 illustrates a connection relationship schematic between the light-emitting element 39 and the array layer according to various embodiments of the present disclosure.

It should be noted that FIG. 10 only illustrates that the first signal line 71 and the second signal line 72 in the array layer 20 are directly formed on the side of the array layer 20. When the second soldering pad 42 is extended, the second soldering pad 42 may be electrically connected to the first signal line 71 and/or the second signal line 72 by extending to the side of the array layer 20 facing the light-emitting element. Such structure may be beneficial for simplifying the film layer structure and the formation process of the curved light-emitting substrate. In some other embodiments of the present disclosure, the first signal line 71 and the second signal line 72 may also be inside the array layer 20 (for example, refer to FIG. 19). When the first signal line 71 or the second signal line 72 is inside the array layer 20 instead of on the surface, the conductive pad 80 electrically connected to the first signal line 71 or the second signal line 72 may be disposed on the side of the array layer 20 facing the light-emitting element; and when the second soldering pad 42 and the conductive pad 80 are electrically connected with each other, the electrical connection between the second soldering pad 42 and the first signal line 71 or the second signal line 72 may be realized. In one embodiment shown in FIG. 19, the first signal line 71 and the second signal line 72 may be disposed inside the array layer 20, the conductive pad 80 electrically connected to the first signal line 71 or the second signal line 72 may be disposed only on the side of the array layer 20 facing the light-emitting element to avoid signal line exposure, which may be beneficial for protecting the first signal line 71 and the second signal line 72 to a certain extent.

It can be understood that FIG. 19 only illustrates the solution that both the first signal line 71 and the second signal line 72 are disposed inside the array layer 20. In some other embodiments of the present disclosure, only one of the first signal line 71 and the second signal line 72 may be inside the array layer 20, and the other may be on the side of the array layer 20 facing the light-emitting element, which may not be limited in embodiments of the present disclosure.

Figure 20:
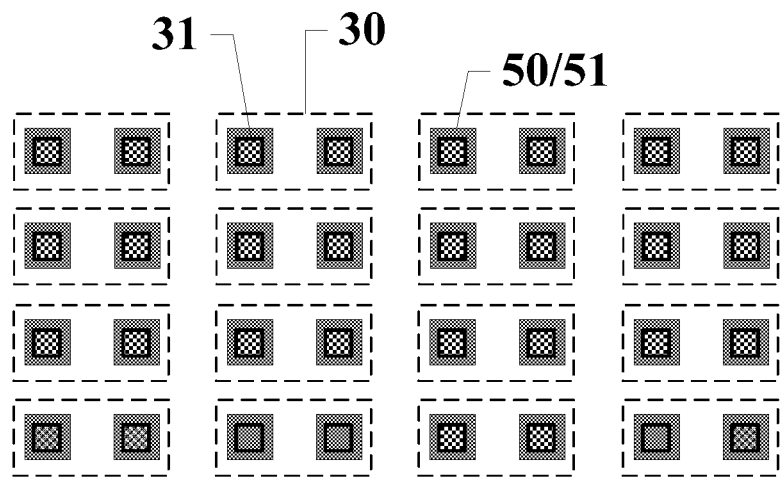
FIG. 20 illustrates another top view showing a relative positional relationship between a flexible padding layer and a light-emitting element.

It should be noted that, in the film layer structural schematic shown in FIG. 19, the relative positional relationship between the flexible padding layer 50 and the light-emitting element is embodied as the relationship shown in FIG. 20. In one embodiment shown in FIG. 20, the flexible pad 51 may overlap the first soldering pad 31 in the light-emitting element 30; along the direction perpendicular to the substrate 10, the first soldering pad 31 may be within the contour of the flexible pad 51; and the flexible pad 51 may be within the contour of the light-emitting element 30. It can be understood that, in order to clearly reflect the positional relationship between the first soldering pad 31 and the flexible padding layer, FIG. 20 only exemplarily illustrates the light-emitting element in the form of a dashed box.

Figure 21:
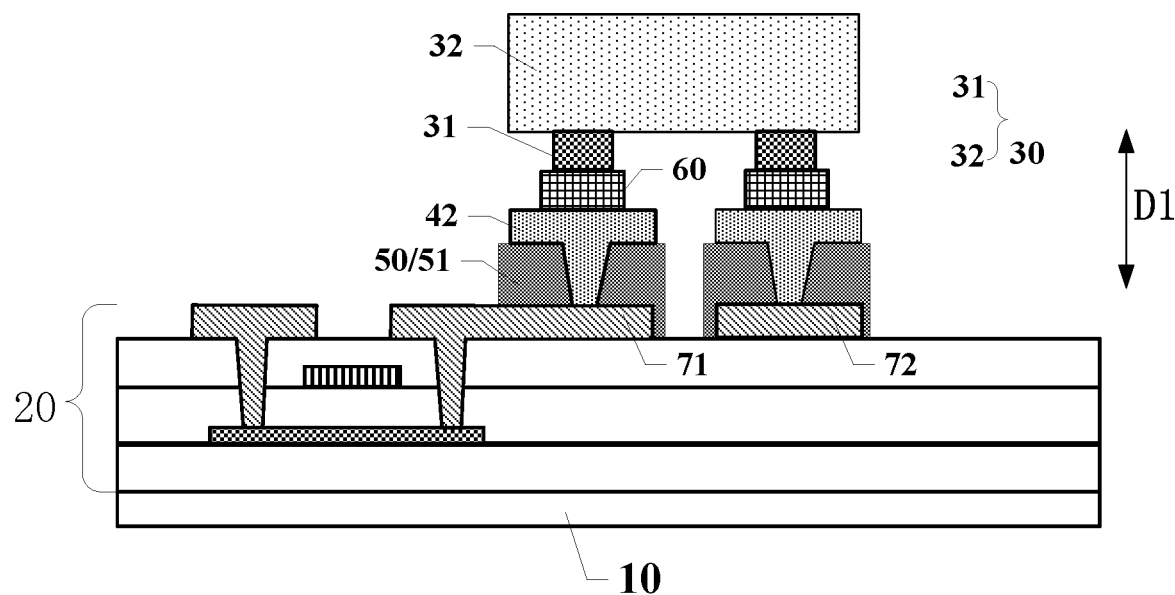
FIG. 21 illustrates another connection relationship schematic between a light-emitting element and an array layer according to various embodiments of the present disclosure.

FIG. 21 illustrates another connection relationship schematic between the light-emitting element 30 and the array layer 20 according to various embodiments of the present disclosure. The top view of the relationship between the light-emitting element 30 and the flexible padding layer may also refer to FIG. 20. In one embodiment, it describes another connection relationship between the second soldering pad 42, the first signal line 71 and the second signal line 72 in the array layer 20 when the flexible padding layer 50 is introduced between the second soldering pad 42 and the array layer 20.

Referring to FIG. 21, in an optional embodiment of the present disclosure, along the first direction D1, the flexible padding layer 50 may be between the second soldering pad 42 and the array layer 20; and the second soldering pad 42 may be electrically connected to the first signal line 71 or the second signal line 72 through the first via in the flexible padding layer 50.

It can be understood that, since the first signal line 71 and the second signal line 72 in the array layer 20 need to be electrically connected to the second soldering pad 42 disposed on the side of the array layer 20 away from the substrate 10, if the film layer where the first signal line 71 or the second signal line 72 is located is not on the side of the array layer 20 away from the substrate 10, the first signal line 71 and the second signal line 72 may be led out to the side of the array layer 20 away from the substrate 10 to conveniently realize the electrical connection between the second soldering pad 42 and the first signal line 71 or the second signal line 72. That is, conductive pads electrically connected to the first signal line 71 and the second signal line 72 may be formed on the side of the array layer 20 facing the light-emitting element. Optionally, the conductive pad may be electrically connected to the first signal line 71 or the second signal line 72 through a via. It should be noted that, in one embodiment shown in FIG. 21, when a via is formed on the flexible padding layer 50, the second soldering pad 42 may be directly electrically connected to the first signal line 71 or the second signal line 72 on the side of the array layer 20 facing the light-emitting element through the via. Such structure may be also beneficial for simplifying the film layer structure and the formation process of the curved light-emitting substrate.

Figure 22:
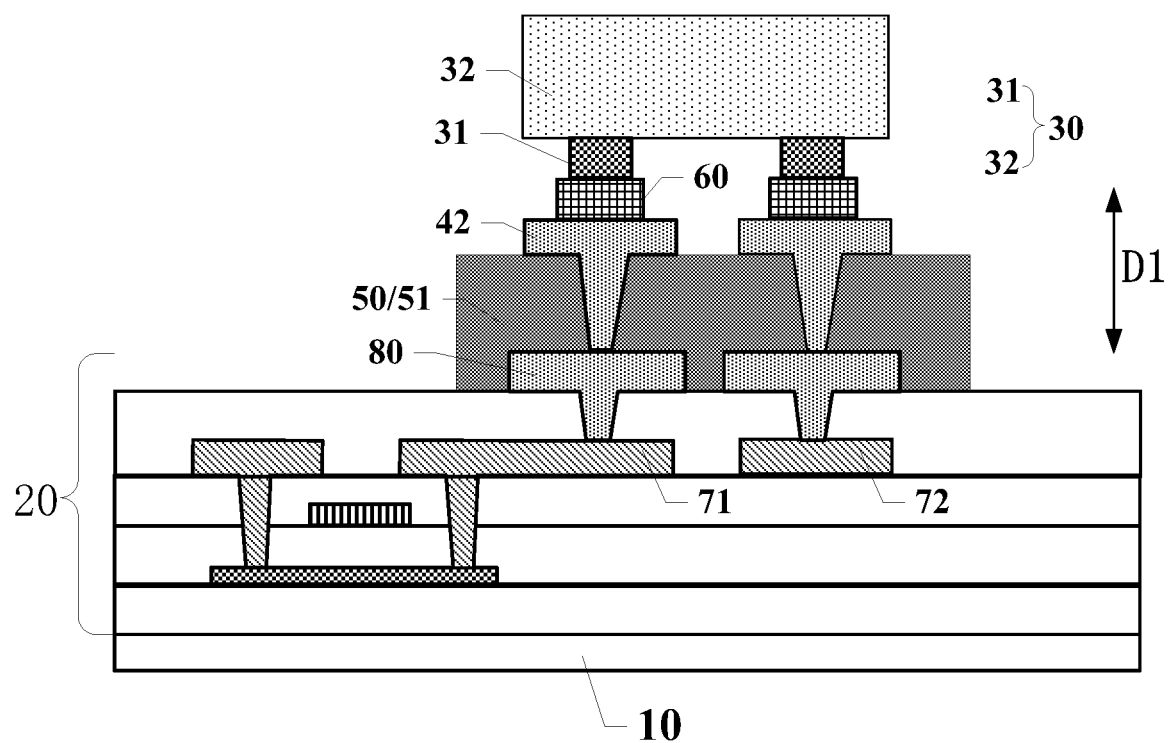
FIG. 22 illustrates another connection relationship schematic between a light-emitting element and an array layer according to various embodiments of the present disclosure.

When the flexible padding layer 50 is introduced between the array substrate and the second soldering pad 42, FIG. 22 illustrates another connection relationship between the second soldering pad 42 and the first signal line 71 or the second signal line 72. The top view of the relationship between the light-emitting element 30 and the flexible padding layer may refer to FIG. 11, and a same light-emitting element 30 may correspond to one flexible pad 51. In one embodiment, a via may be formed on the flexible padding layer 50; and along the direction perpendicular to the substrate 10, the via may overlap the conductive pad 80 on the side of the array layer 20 facing the light-emitting element. When the second soldering pad 42 is formed on the side of the flexible padding layer 50 away from the substrate 10, the second soldering pad 42 may form the electrical connection with the conductive pad 80 through the via and further form the electrical connection with the first signal line 71 or the second signal line 72 on the array layer 20. In such way, the coverage area of the second soldering pad 42 may not need to be increased, which may be beneficial for saving formation cost.

It should be noted that when the second soldering pad 42 is electrically connected to the first signal line 71 or the second signal line 72 through the via in the flexible padding layer 50, since at least a part of the second soldering pad 42 is filled into the via, the amount of material required to form the second soldering pad 42 may be suitably increased at this point, which may ensure that the second soldering pad 42 on the side of the flexible padding layer 50 away from the substrate 10 can form a flat surface, and may avoid that the side of the second soldering pad 42 facing the light-emitting element is not flat, resulting unreliable connection between the light-emitting element 30 and the second soldering pad 42.

Referring to FIG. 10, in an optional embodiment of the present disclosure, the array layer 20 may include a first metal layer M1 and a second metal layer M2; and the array substrate may include a transistor T0. The gate electrode of the transistor T0 may be in the first metal layer M1; the source and drain electrodes of the transistor T0 may be in the second metal layer M2; and the first signal line 71 and the second signal line 72 may be in the second metal layer M2.

For example, when both the first signal line 71 and the second signal line 72 electrically connected to the second soldering pad 42 are disposed on the second metal layer M2, a new film layer may not need to be introduced for the first signal line 71 and the second signal line 72 in the curved light-emitting substrate, and existing second metal layer M2 may be reused. The first signal line 71 and the second signal line 72 may be formed simultaneously as other wirings are formed on the second metal layer M2, thereby being beneficial for simplifying the formation process when the first signal line 71 and the second signal line 72 are introduced into the curved light-emitting substrate, and further being beneficial for improving the production efficiency of the curved light-emitting substrate.

Figure 23:
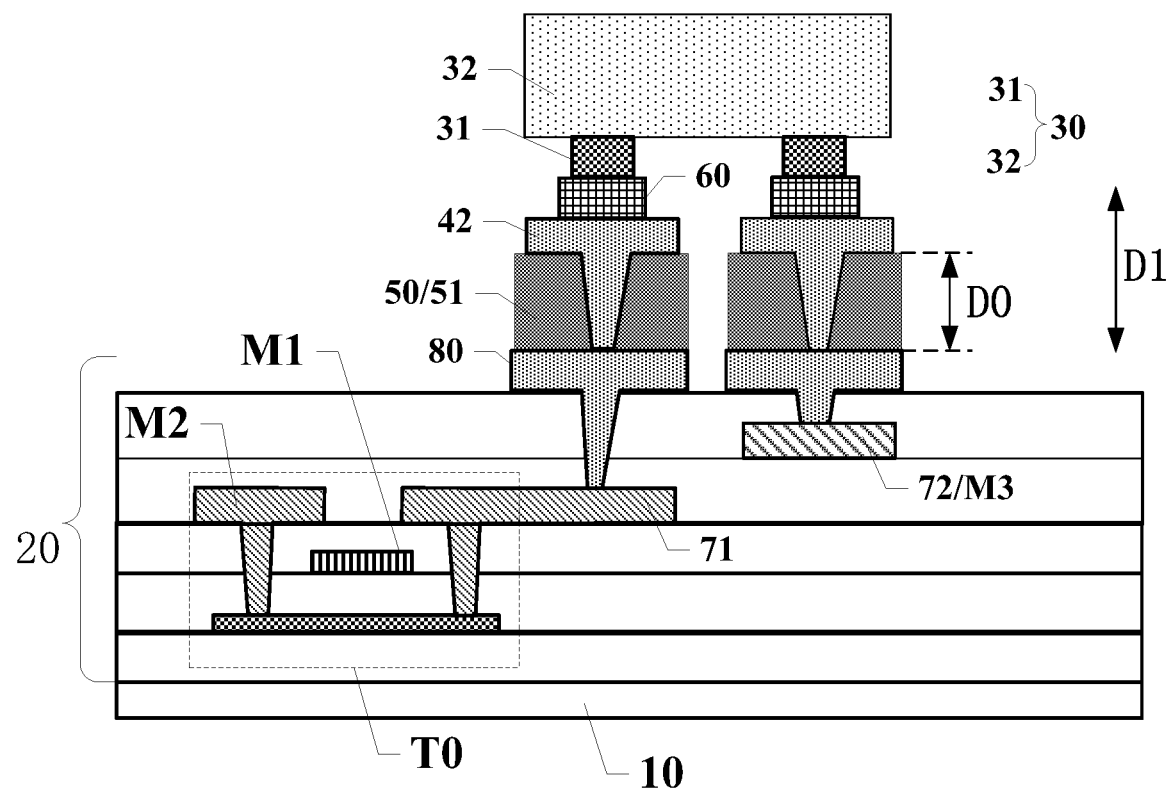
FIG. 23 illustrates another connection relationship schematic between a light-emitting element and an array layer according to various embodiments of the present disclosure.

It should be noted that, above-mentioned embodiment only illustrates the solution that the first signal line 71 and the second signal line 72 are disposed in a same layer, and both are arranged in the second metal layer M2. In some other embodiments of the present disclosure, the first signal line 71 and the second signal line 72 may also be disposed in different layers. For example, the first signal line 71 may be disposed at the second metal layer M2, and the second signal line 72 maybe disposed at the third metal layer M3. For example, referring to FIG. 23, FIG. 23 illustrates another connection relationship schematic between the light-emitting element 30 and the array layer 20 according to various embodiments of the present disclosure. The top view of the relationship between the light-emitting element 30 and the flexible padding layer may also refer to FIG. 20, where the third metal layer M3 may be on the side of the second metal layer M2 away from the substrate 10. Obviously, in some other embodiments of the present disclosure, both the first signal line 71 and the second signal line 72 may also be disposed at the third metal layer M3, which may not be limited in the present disclosure.

Referring to FIG. 23, in an optional embodiment of the present disclosure, the thickness of the flexible pad 51 may be greater than the thickness of each of the first soldering pad 31 and the second soldering pad 42. It can be understood that the thickness of the flexible pad 51 may refer to the thickness of the flexible pad 51 along the first direction D1.

For example, the thickness of the flexible padding layer 50 is closely related to the stress release effect of the flexible padding layer 50. Within a certain thickness range, the larger the thickness of the flexible padding layer 50 is, the more obvious the stress release effect is. In embodiments of the present disclosure, the thickness of the flexible padding layer 50 may be set to be greater than the thickness of each of the first soldering pad 31 and the second soldering pad 42. Compared with the manner that the thickness of the flexible padding layer 50 is less than or equal to the thickness of each of the first soldering pad 31 and the second soldering pad 42, the stress release effect may be desirable which may be more beneficial for reducing the influence of the bending stress on the first soldering pad 31 and the second soldering pad 42, thereby being more beneficial for improving the fixing reliability and electrical connection reliability of the light-emitting element 30 and the array layer 20.

In an optional embodiment of the present disclosure, the thickness of the flexible pad 51 may be D0, where $10\ \mu m \leq D0 \leq 1000\ \mu m$.

As mentioned above, the thickness of the flexible padding layer 50 is closely related to the stress release effect of the flexible padding layer 50. If the thickness of the flexible padding layer 50 is relatively small, for example, less than 10 μm, its effect on stress release may not be obvious. However, when the thickness of the flexible padding layer 50 reaches a certain relatively large value, the stress release effect may be no longer obvious if the thickness is further increased. For example, when the thickness of the flexible padding layer 50 is greater than 1000 μm, its effect on stress release may not be further improved compared to when the thickness is 1000 μm, and the overall thickness of the curved light-emitting substrate may also be affected. Therefore, in embodiments of the present disclosure, the thickness of the flexible padding layer 50 may be set between 10 μm and 1000 μm, which may have a desirable release effect on the bending stress and may not greatly affect the overall thickness of the curved light-emitting substrate.

Optionally, the thickness of the flexible padding layer 50 may be selected as 100 μm, 200 μm, 300 μm, and the like.

In an optional embodiment of the present disclosure, the flexible padding layer 50 may be made of polyimide.

Polyimide is a class of polymers containing imide rings on the main chain. Polyimide is one of organic polymer materials with the best comprehensive properties. Polyimide has a wide range of operating temperatures and high insulating properties and can be used as flexible films. When the flexible padding layer 50 in the present disclosure is made of polyimide, the flexible padding layer 50 may have a relatively low elastic modulus, and desirable flexibility and stress release effect.

Obviously, in some other embodiments of the present disclosure, the flexible padding layer 50 may also be made of other flexible materials, such as polyvinyl alcohol, polyethylene terephthalate, polyurethane, polyethylene naphthalate, polydimethylsiloxane, polycarbonate, cycloolefin polymer, and/or any other suitable materials, which may not be limited in the present disclosure.

Figure 24:
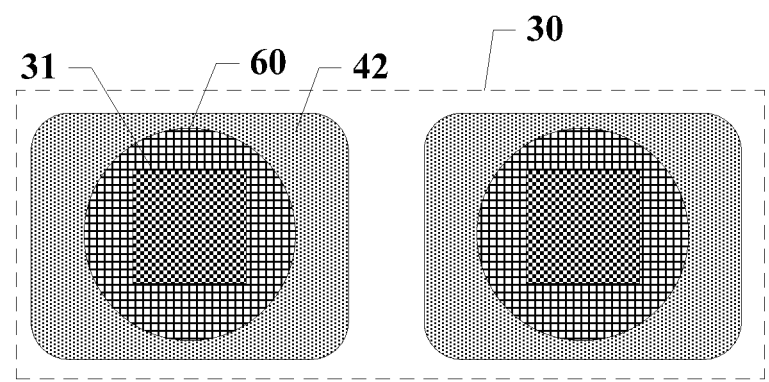
FIG. 24 illustrates a top view of a first soldering pad, an electrical connection portion, and a second soldering pad in a curved light-emitting substrate according to various embodiments of the present disclosure.

FIG. 24 illustrates a top view of the first soldering pad 31, an electrical connection portion 60, and the second soldering pad 42 in the curved light-emitting substrate according to various embodiments of the present disclosure. In one embodiment, it describes the relative positional relationship of the first soldering pad 31, the electrical connection portion 60, and the second soldering pad 42 corresponding to a same light-emitting element 30. In one embodiment, the orthographic shape of the first soldering pad 31 on the substrate 10 may be a rectangle, the orthographic shape of the electrical connection portion 60 on the substrate 10 may be a circle, the orthographic shape of the second soldering pad 42 on the substrate 10 may be a rounded rectangle as an example for illustration, which may not limit actual shapes of the orthographic projections of the first soldering pad 31, the electrical connection portion 60, and the second soldering pad 42 on the substrate 10. In some other embodiments of the present disclosure, the shapes of the orthographic projections of the first soldering pad 31, the electrical connection portion 60, and the second soldering pad 42 on the substrate 10 may also be embodied in any other feasible shapes, which may not be limited in the present disclosure.

Referring to FIGS. 3, 5, 10, 6 and 24, in an optional embodiment of the present disclosure, the curved light-emitting substrate may further include the electrical connection portion 60; along the first direction D1, the electrical connection portion 60 may be between the first soldering pad 31 and the second soldering pad 42; and along the first direction D1, the first soldering pad 31 may be within the orthographic projection of the electrical connection portion 60 on the substrate 10, and the electrical connection portion 60 may be within the orthographic projection of the second soldering pad 42 on the substrate 10.

In the curved light-emitting substrate provided in embodiments of the present disclosure, the light-emitting element 30 may be electrically connected to the array layer 20 through the electrical connection portion 60. For example, the first soldering pad 31 in the light-emitting element 30 may be electrically connected to the second soldering pad 42 on the array layer 20 through the electrical connection portion 60, and the second soldering pad 42 may be electrically connected to the signal line in the array layer 20, such that the electrical connection between the light-emitting element 30 and the array layer 20 may be realized. Optionally, the electrical connection portion 60 may be embodied as, for example solder paste; and in an actual formation process, the first soldering pad 31 of the light-emitting element 30 and the second soldering pad 42 on the array layer 20 may be soldered by a vacuum reflow soldering manner.

Embodiments of the present disclosure limit that the area of the orthographic projection of the first soldering pad 31 on the substrate 10 may be less than the area of the orthographic projection of the electrical connection portion 60 on the substrate 10, and the orthographic projection of the first soldering pad 31 on the substrate 10 may be within the orthographic projection of the electrical connection portion 60 on the substrate 10. In such way, it is beneficial to ensure that one end of the first soldering pad 31 facing the electrical connection portion 60 may be in contact with the electrical connection portion 60 to form the electrical connection, thereby being beneficial for improving the electrical connection reliability between the first soldering pad 31 and the electrical connection portion 60. In addition, embodiments of the present disclosure limit that the area of the orthographic projection of the electrical connection portion 60 on the substrate 10 may be less than the area of the orthographic projection of the second soldering pad 42 on the substrate 10, and the orthographic projection of the electrical connection portion 60 on the substrate 10 may be within the orthographic projection of the second soldering pad 42 on the substrate 10. In such way, it is beneficial to ensure that one end of the electrical connection portion 60 facing the second soldering pad 42 may be in contact with the second soldering pad 42 to form the electrical connection, thereby being beneficial for improving the electrical connection reliability between the electrical connection portion 60 and the second soldering pad 42, and further being beneficial for improving the electrical connection reliability between the light-emitting element 30 and the array layer 20.

Figure 25:
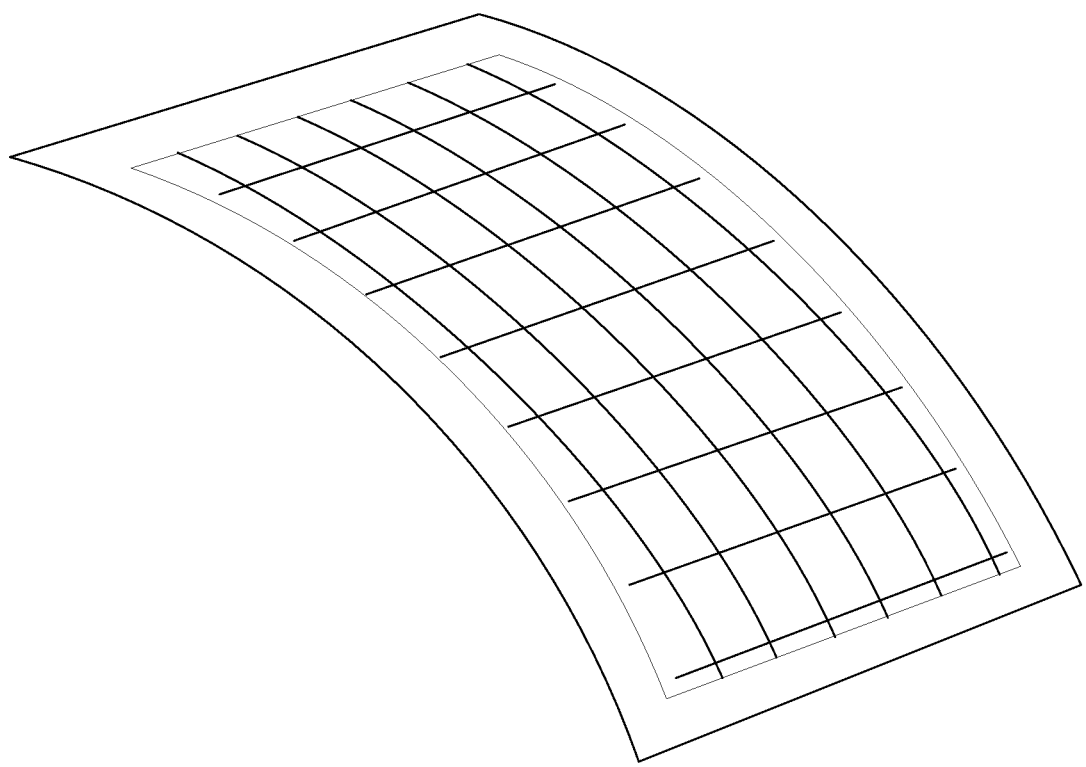
FIG. 25 illustrates a schematic of bending a curved light-emitting substrate according to various embodiments of the present disclosure.

FIG. 25 illustrates a schematic of bending the curved light-emitting substrate according to various embodiments of the present disclosure. Referring to FIGS. 2-5 and 25, in an optional embodiment of the present disclosure, the curvatures of all regions on a display surface of the curved light-emitting substrate may be same; the flexible padding layer 50 may include the plurality of flexible pads 51; and all flexible pads 51 may have a same thickness.

For example, the curved light-emitting substrate shown in FIG. 25 may have an overall curved structure. The curvatures of all regions in the display surface may be same, which may indicate that the curvature degree of all regions in the display surface may be same. Since the curved light-emitting substrate is overall curved, in embodiments of the present disclosure, flexible pads 51 may be disposed in corresponding regions of all light-emitting elements 30 to release the bending stress and improve the fixing reliability and electrical connection reliability of the light-emitting element 30 and the array layer 20. Since the thickness of the flexible padding layer 50 is related to its stress releasing effect, when the curvatures of all regions in the display surface are same, the thicknesses of the flexible pads 51 in the curved light-emitting substrate in the present disclosure may be set to be same. Therefore, the flexible pads 51 have a same stress release effect, and the fixing reliability of the light-emitting element 30 and the array layer 20 in all regions may be same or substantially same. When the thicknesses of all flexible padding layers 50 in the curved light-emitting substrate is set to be same, a same thickness standard may be configured to form the flexible padding layers 50 in different regions, which may be beneficial for simplifying the formation complexity of the flexible padding layers 50.

Figure 26:
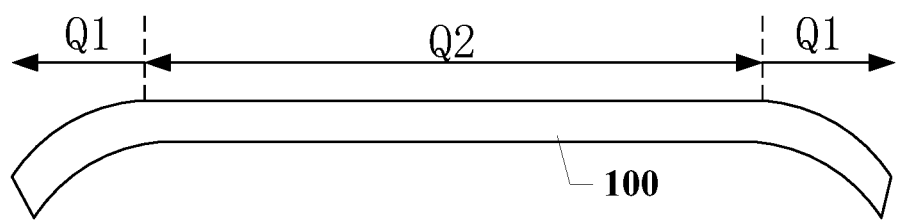
FIG. 26 illustrates another schematic of bending a curved light-emitting substrate according to various embodiments of the present disclosure.

FIG. 26 illustrates another schematic of bending a curved light-emitting substrate according to various embodiments of the present disclosure. In one embodiment, it describes a solution that the curvatures of at least partial regions of the curved light-emitting substrate may be different.

Referring to FIGS. 3-5 and 26, in an optional embodiment of the present disclosure, the curved light-emitting substrate may include a first region Q1 and a second region Q2; the curvature of the first region Q1 may be greater than the curvature of the second region Q2; the flexible padding layer 50 may include the plurality of flexible pads 51; the thickness of the flexible pad 51 in the first region Q1 is D1; and the thickness of the flexible pad 51 in the second region Q2 is D2, where D1>D2.

For example, another curved structure of the curved light-emitting substrate is illustrated in one embodiment. In one embodiment, the middle portion (the second region Q2) of the curved light-emitting substrate may have a relatively small degree of curvature, and two side portions (the first regions Q1) may have a relatively large degree of curvature, which may be taken as an example for illustration. That is, the curvature of the middle portion may be less than the curvature of two side portions. At this point, the bending stress on two side portions may be greater than the bending stress on the middle portion. When the flexible padding layer 50 is introduced in such curved light-emitting substrate, the thickness of the flexible padding layer 50 in the region with the relatively large curvature (the first region Q1) may be set to be greater than the thickness of the flexible padding layer 50 in the region with the relatively small curvature (the second region Q2). The flexible padding layer 50 with a relatively large thickness may release a relatively large bending stress. Therefore, such design may balance the influence of the bending stress on the first soldering pad 31 and the second soldering pad 42 in the regions with different curvatures, such that the bending stress in each region may be effectively released, and the fixing reliability of the light-emitting element 30 and the array layer 20 in each region may be same or substantially same.

In an optional embodiment of the present disclosure, in the curved light-emitting substrate provided in embodiments of the present disclosure, the light-emitting element may be a micro light-emitting diode or a sub-millimeter light-emitting diode. The sub-millimeter light-emitting diode, that is Mini LED, refers to an LED with a die magnitude of about 100-1000 microns. A backlight module made of Mini LEDs may have a high yield and may be able to provide various cutting characteristics, e.g., having any desired irregular shapes, which allows the backlight module to coordinate with a flexible substrate to provide a highly-curved backlight form with desirable color rendering. The micro light-emitting diode, that is Micro LED, refers to an LED with a die magnitude of about 1-10 microns, which may realize a display screen with pixel particles of 0.05 mm or smaller. The micro LED may consume significantly low power and have desirable material stability with no image retention.

Figure 27:
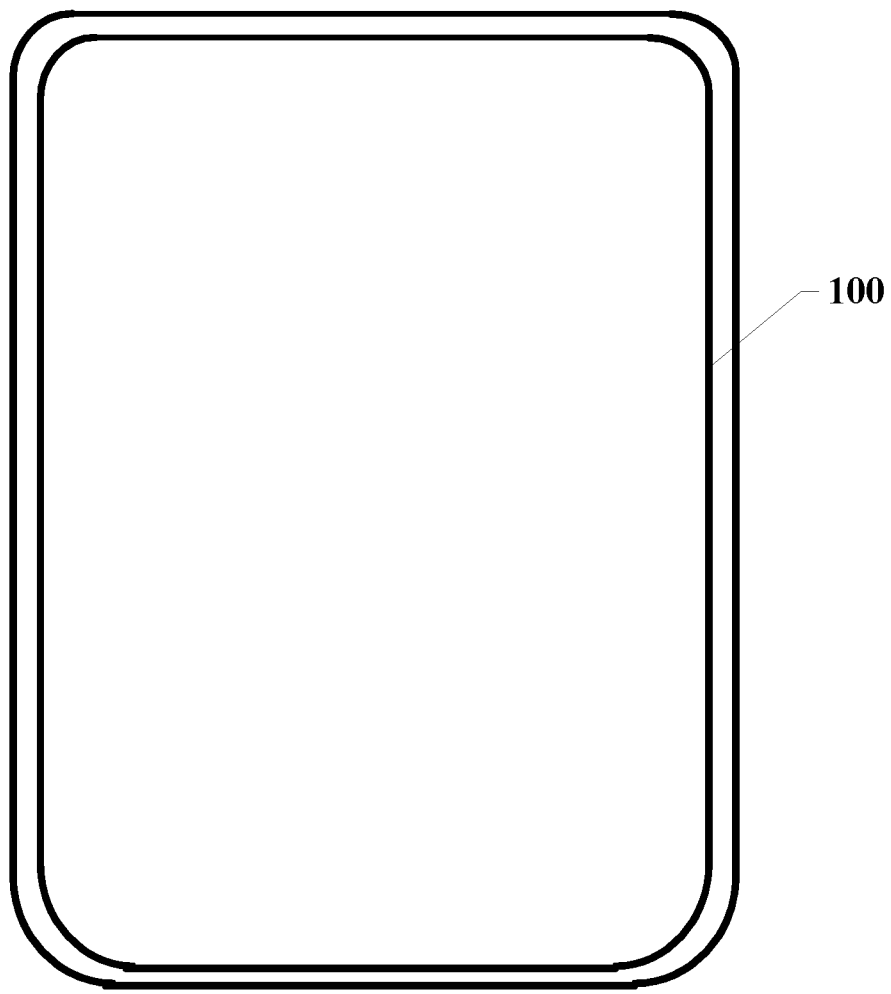
FIG. 27 illustrates a top structural view of a display apparatus according to various embodiments of the present disclosure.

Based on a same inventive concept, the present disclosure further provides a display apparatus 200. FIG. 27 illustrates a top structural view of the display apparatus 200 according to various embodiments of the present disclosure. The display apparatus 200 may include the curved light-emitting substrate 100 provided in above-mentioned embodiments of the present disclosure.

The display apparatus 200 provided in embodiments of the present disclosure may be a curved display apparatus. Referring to FIGS. 1-5, due to the introduction of the flexible padding layer 50, the bending stress may be effectively released, which may be beneficial for improving the fixing reliability and electrical connection reliability between the light-emitting element 30 and the array layer 20 in the display apparatus 200, and further be beneficial for improving the display reliability of the display apparatus 200.

Optionally, the display apparatus 200 provided in embodiments of the present disclosure may be embodied as, for example, a liquid crystal display apparatus including a display panel and a backlight module that provides a light source for the display panel. For such case, the backlight module may use the curved light-emitting substrate provided in above-mentioned embodiments of the present disclosure.

Optionally, the display apparatus 200 provided in embodiments of the present disclosure may also be embodied as, for example, a Mini LED display apparatus or a Micro LED display apparatus which includes a Mini LED display panel or a Micro LED display panel. For such case, the Mini LED display panel or the Micro LED display panel may use the curved light-emitting substrate provided in above-mentioned embodiments of the present disclosure.

It should be noted that, embodiments of the display apparatus 200 provided in the present disclosure may refer to above-mentioned embodiments of the curved light-emitting substrate, which may not be described in detail herein. The display apparatus provided in embodiment of the present disclosure may be embodied as any products or components with display function, such as a mobile phone, a tablet computer, a television, a monitor, a notebook computer, a digital photo frame, and/or a navigator.

Figure 28:
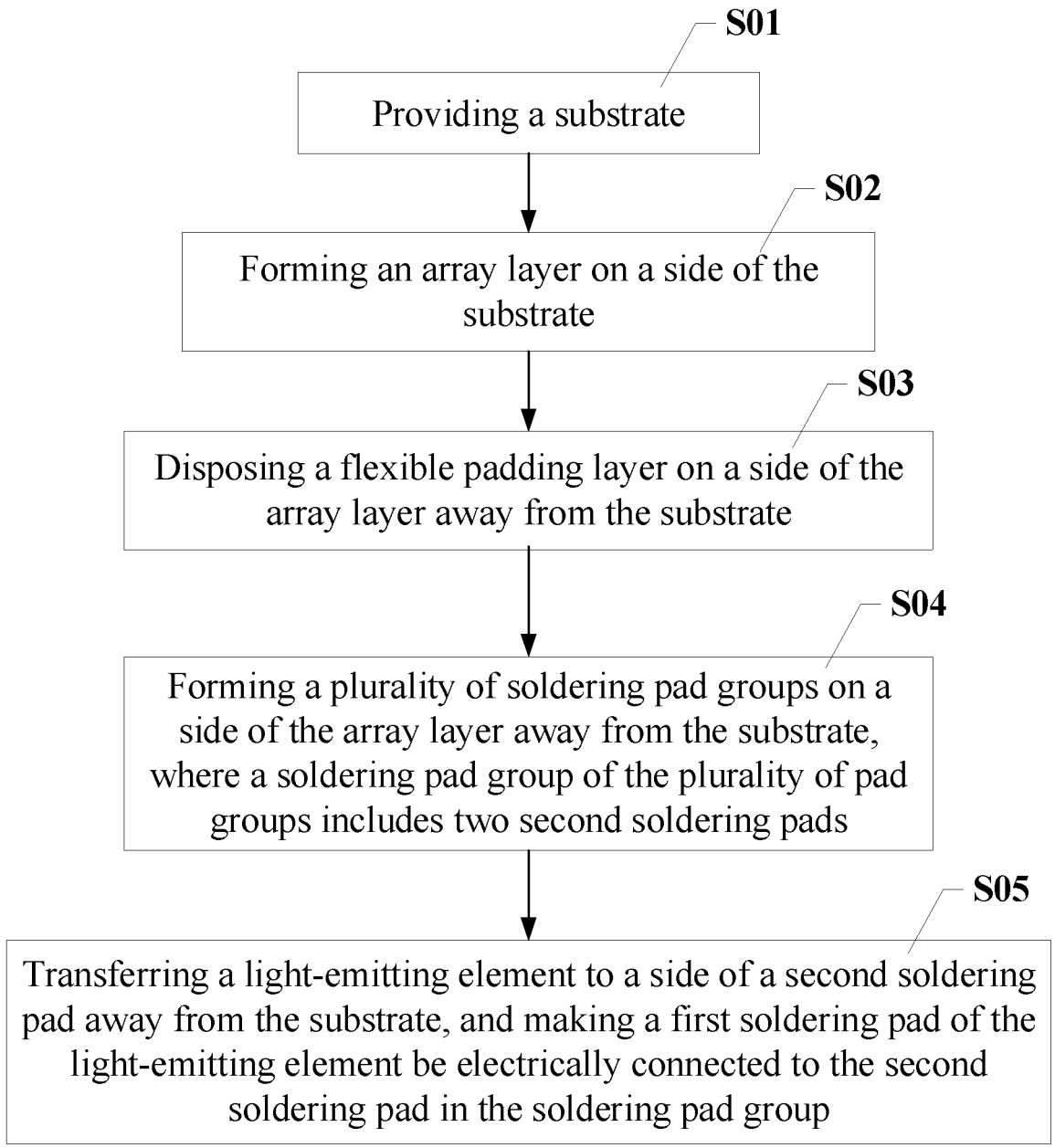
FIG. 28 illustrates a flowchart of a formation method of a curved light-emitting substrate according to various embodiments of the present disclosure.

Based on a same inventive concept, the present disclosure further provides a formation method of a curved light-emitting substrate. FIG. 28 illustrates a flowchart of the formation method for the curved light-emitting substrate according to various embodiments of the present disclosure. The formation method may include following exemplary steps.

At S01, the substrate 10 may be provided.

At S02, the array layer 20 may be formed on the side of the substrate 10.

Figure 29:
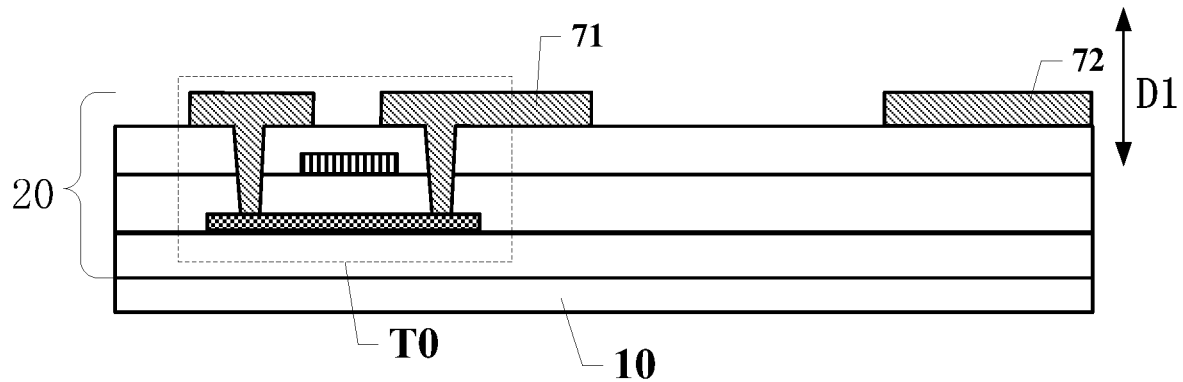
FIG. 29 illustrates a structural schematic of forming an array layer on a side of a substrate.

Referring to FIG. 29, FIG. 29 illustrates a structural schematic of forming the array layer 20 on the side of the substrate 10. The array layer 20 may include a transistor T0, the first signal line 71, and the second signal line 72. The first signal line 71 may be electrically connected to the first terminal of the transistor T0 for receiving the first signal transmitted by the transistor T0. The second signal line 72 may be configured to receive the second signal. Optionally, the first signal line 71 may be electrically connected to the drain electrode of the transistor T0; and the first signal line 71 and the drain electrode of the transistor T0 may be disposed at a same layer and electrically connected with each other directly. FIG. 29 only illustrates the solution that the first signal line 71 and the second signal line 72 are disposed at a same layer. In some other embodiments of the present disclosure, the first signal line 71 and the second signal line 72 may also be disposed at different layers, which may not be limited in the present disclosure. The light-emitting element may be controlled to emit light by providing an electrical signal to the light-emitting element through the first signal line 71 and the second signal line 72. Optionally, the curved light-emitting substrate provided in the present disclosure may be configured with a binding region for binding a control chip or a flexible printed circuit (FPC); the binding region may be correspondingly disposed with a plurality of conductive pads; the second signal line 72 in the present disclosure may be electrically connected to the conductive pad in above-mentioned binding region; and after the control chip or the FPC is bound to the conductive pad in the binding region, the second signal may be transmitted to the second signal line 72 through the control chip or the FPC.

Figure 30:
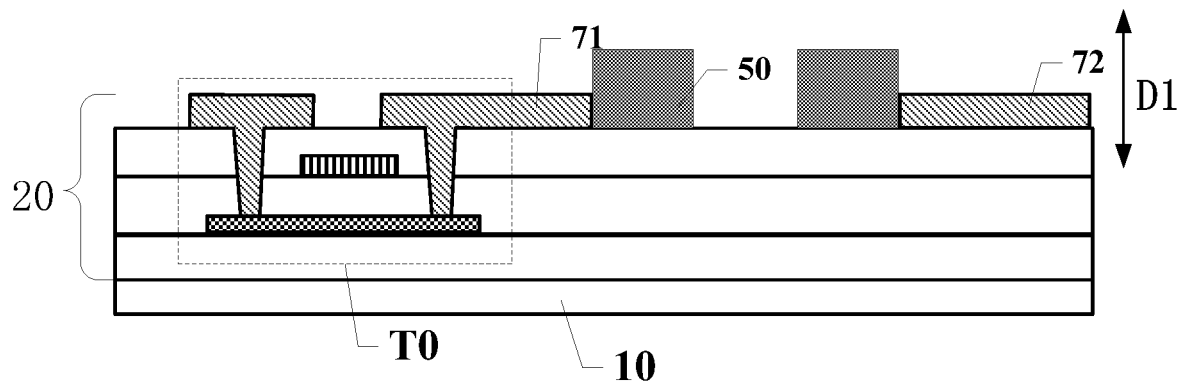
FIG. 30 illustrates a structural schematic of forming a flexible padding layer on a side of an array layer away from a substrate.

At S03, the flexible padding layer 50 may be disposed on the side of the array layer 20 away from the substrate 10. FIG. 30 illustrates a structural schematic of forming the flexible padding layer on the side of the array layer away from the substrate.

Figure 31:
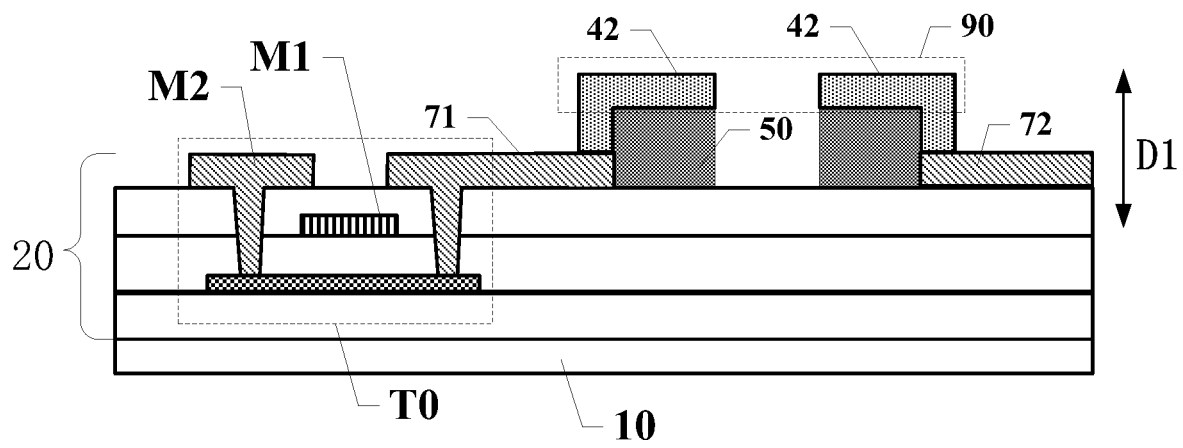
FIG. 31 illustrates another structural schematic of forming a soldering pad group on a side of an array layer.

At S04, a plurality of soldering pad groups 90 may be formed on the side of the array layer 20 away from the substrate 10. Referring to FIG. 31, the soldering pad group 90 may include two second soldering pads 42; and two second soldering pads 42 in a same soldering pad group 90 may be electrically connected to the first signal line 71 and the second signal line 72, respectively. FIG. 31 illustrates another structural schematic of forming the soldering pad group 90 on the side of the array layer 20.

At S05, on the basis of FIG. 31 and FIG. 10, the light-emitting element 30 may be transferred to the side of the second soldering pad 42 away from the substrate 10, and the first soldering pad 31 of the light-emitting element 30 may be electrically connected to the second soldering pad 42 in the soldering pad group 90.

In some optional embodiments of the present disclosure, the flexible padding layer 50 may be further disposed between the light-emitting main body 32 of the light-emitting element 30 and the first soldering pad 31, for example, referring to FIG. 5.

For example, in the formation method of the curved light-emitting substrate provided in embodiments of the present disclosure, before forming the second soldering pad 42 on the side of the array layer 20 away from the substrate 10, the flexible padding layer 50 may be first formed on the side of the array layer 20 away from the substrate 10, the second soldering pad 42 may be formed on the side of the flexible padding layer 50 away from the substrate 10, and finally, the first soldering pad 31 of the light-emitting element 30 may be electrically connected to the second soldering pad 42 on the array layer 20. In some other embodiments of the present disclosure, the flexible padding layer 50 may be further disposed between the light-emitting main body 32 of the light-emitting element 30 and the first soldering pad 31, and the light-emitting element 30 disposed with the flexible padding layer 50 may be electrically connected to the array layer 20.

After completing the electrical connection between the light-emitting element 30 and the array layer 20 in embodiments of the present disclosure, that is, after above-mentioned S05, a partial region of the light-emitting substrate may be bent as required to form the curved light-emitting substrate.

When the light-emitting substrate is bent, the light-emitting element 30 and the second soldering pad 42 may be deformed to generate bending stress. In the present disclosure, the flexible padding layer 50 may be disposed between the light-emitting main body 32 and the array layer 20, and a large fraction of the bending stress transmitted to the side of the array layer 20 facing the light-emitting element may act on such flexible padding layer 50, and only a small fraction of the bending stress may remain on the side of the array layer 20 where the flexible padding layer 50 is not disposed. When such small fraction of the bending stress is further transmitted towards the direction of the light-emitting element 30, the bending stress transmitted to the second soldering pad 42 and the first soldering pad 31 may be reduced. That is, the flexible padding layer 50 may effectively release the bending stress, effectively reduce the bending stress on the light-emitting element 30 and the second soldering pad 42 and reduce the detaching risk of the light-emitting element 30 due to bending stress, which is beneficial for improving the light-emitting reliability of the curved light-emitting substrate.

When the flexible padding layer 50 is further disposed between the light-emitting main body 32 and the first soldering pad 31 in the present disclosure, such as in FIG. 5, the bending stress transmitted from the second soldering pad 42 to the first soldering pad may be released through such flexible padding layer 50. The bending stress actually acting on the first soldering pad 31 and the second soldering pad 42 may be further reduced. Therefore, it is beneficial for avoiding that the light-emitting element 30 is detached from the array layer 20 due to the action of the bending stress or the connection reliability of the first soldering pad 31 and the second soldering pad 42 is reduced, thereby being further beneficial for improving the fixing reliability and electrical connection reliability between the light-emitting element 30 and the array layer 20.

In an optional embodiment of the present disclosure, referring to FIG. 3, FIG. 5 or FIG. 10, when the flexible padding layer 50 is disposed on the side of the array layer 20 away from the substrate 10, the flexible padding layer 50 may include the plurality of flexible pads 51. When the second soldering pad 42 is formed on the side of the flexible pad 51 away from the substrate 10, the second soldering pad 42 may cover the side of the flexible pad 51 away from the substrate 10 and extend from the side of the flexible pad 51 to the side of the array layer 20 facing the light-emitting element, thereby being electrically connected to the array layer 20. For example, the second soldering pad 42 may be electrically connected to the first signal line 71 or the second signal line 72 on the array layer 20.

For example, when the flexible pads 51 are introduced between the second soldering pads 42 and the array layer 20, the plurality of the flexible pads 51, which may correspond to the number of the first soldering pads 31 or the second soldering pads 42, may be disposed. In order to realize the electrical connection between the second soldering pad 42 and the signal line in the array layer 20, when the second soldering pad 42 is formed on the side of the flexible padding layer 50 away from the substrate 10, the area of the second soldering pad 42 may be suitably increased, such that at least a part of the second soldering pad 42 may extend from the flexible pad 51 to the side of the array layer 20 facing the light-emitting element to form the electrical connection with the signal line or conductive pad on the side of the array layer 20 facing the light-emitting element, thereby realizing the electrical connection between the second soldering pad 42 and the array layer 20. When the electrical connection with the array layer 20 is realized by extending the second soldering pad 42, it is beneficial for ensuring the flatness of a part of the second soldering pad 42 on the side of the flexible pad 51 away from the substrate 10. When the first soldering pad 31 and the second soldering pad 42 are electrically connected by an intermediate medium such as solder paste (embodied as the electrical connection portion 60 in the present disclosure), the second soldering pad 42 may provide a flat surface for the solder paste, such that, it is beneficial for improving the electrical connection reliability between the light-emitting element 30 and the second soldering pad 42.

Referring to FIGS. 21-22, in an optional embodiment of the present disclosure, after the flexible padding layer 50 is disposed on the side of the array layer 20 away from the substrate 10, the method may further include forming an opening (configured to form a via) on the flexible padding layer 50. When the second soldering pad 42 is formed on the side of the flexible padding layer 50 away from the substrate 10, at least a part of the second soldering pad 42 may extend into the opening to be electrically connected to the array layer 20.

In one embodiment, the opening may be formed on the flexible padding layer 50, and along the direction perpendicular to the substrate 10, the via may overlap the conductive pad on the side of the array layer 20 facing the light-emitting element. When the second soldering pad 42 is formed on the side of the flexible padding layer 50 away from the substrate 10, the second soldering pad 42 may form the electrical connection with the conductive pad through the via, thereby further forming the electrical connection with the first signal line 71 or the second signal line 72 on the array layer 20. In such way, the coverage area of the second soldering pad 42 may not need to be increased, which may be beneficial for saving formation cost.

As disclosed above, the curved light-emitting substrate and its formation method and the display apparatus provided in the present disclosure may at least achieve the following beneficial effects.

The curved light-emitting substrate and the display apparatus provided in the present disclosure may include the substrate, the array layer disposed on the substrate, and the light-emitting element electrically connected to the array layer. The side of the array layer facing the light-emitting element may be disposed with the second soldering pad; the light-emitting element may include the light-emitting main body and the first soldering pad at the light-emitting main body facing the array layer; the first soldering pad and the second soldering pad may be electrically connected with each other; and the light-emitting element may realize light emission using the electrical signal provided by the array layer. When the curved light-emitting substrate is bent, the light-emitting element and the second soldering pad may be deformed to generate the bending stress. In the present disclosure, the flexible padding layer may be introduced between the light-emitting main body and the array layer, and the flexible padding layer may release such fraction of the bending stress to a certain extent, which may effectively reduce the bending stress on the light-emitting element and the second soldering pad and reduce the detaching risk of the light-emitting element due to bending stress, thereby improving the light-emitting reliability of the curved light-emitting substrate.

In the formation method of the curved light-emitting substrate provided in the present disclosure, before forming the plurality of soldering pad groups on the side of the array layer away from the substrate, the flexible pad may be firstly disposed on the side of the array layer away from the substrate, the second soldering pad may be formed on the side of the flexible pad away from the substrate, and finally, the light-emitting element may be electrically connected to the second soldering pad. The flexible padding layer may also be disposed between the light-emitting main body of the light-emitting element and the first soldering pad. In such way, when the substrate and the array layer are bent to form the curved light-emitting substrate, the flexible padding layer may release the bending stress generated during the bending process to a certain extent, which may effectively reduce the bending stress on the light-emitting element and the second soldering pad and reduce the detaching risk of the light-emitting element due to bending stress, thereby improving the light-emitting reliability of the curved light-emitting substrate.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:
1. A curved light-emitting substrate, comprising:
a substrate;
an array layer, disposed on a side of the substrate;
a plurality of light-emitting elements, electrically connected to the array layer, wherein a light-emitting element of the plurality of light-emitting elements includes a light-emitting main body and a first soldering pad on a side of the light-emitting main body facing the array layer;
a second soldering pad which is on a side of the array layer facing the light-emitting element and electrically connected to the first soldering pad; and
a flexible padding layer, between the light-emitting main body and the array layer along a first direction, wherein the first direction is perpendicular to a surface of the array layer,
wherein the flexible padding layer includes a plurality of flexible pads; and the plurality of flexible pads is not connected to each other; and
wherein among at least a part of the plurality of flexible pads, a first spacing is between two adjacent flexible pads, and an orthographic projection of the first spacing on the substrate overlaps an orthographic projection of the light-emitting main body on the substrate.

2. The curved light-emitting substrate according to claim 1, wherein:
an elastic modulus of the flexible padding layer is less than an elastic modulus of the substrate, and less than an elastic modulus of each of the first soldering pad and the second soldering pad.

3. The curved light-emitting substrate according to claim 1, wherein:
along the first direction, the flexible padding layer is between the second soldering pad and the array layer; and/or the flexible padding layer is between the light-emitting main body and the first soldering pad.

4. The curved light-emitting substrate according to claim 1, wherein:
along the first direction, a flexible pad of the plurality of flexible pads overlaps the first soldering pad.

5. The curved light-emitting substrate according to claim 4, wherein:
the plurality of flexible pads is arranged in a one-to-one correspondence with the plurality of light-emitting elements; and
in a same light-emitting element, an orthographic projection of the first soldering pad on the substrate is within an orthographic projection of a flexible pad on the substrate.

6. The curved light-emitting substrate according to claim 4, wherein:
a same light-emitting element includes two first soldering pads; and the plurality of flexible pads is arranged in a one-to-one correspondence with the two first soldering pads.

7. The curved light-emitting substrate according to claim 6, wherein:
for the plurality of flexible pads and the two first soldering pads which are arranged in a one-to-one correspondence, along the first direction, an orthographic projection of the two first soldering pad on the substrate is within the orthographic projection of a flexible pad on the substrate.

8. The curved light-emitting substrate according to claim 4, wherein:
a thickness of the flexible pad is greater than a thickness of each of the first soldering pad and the second soldering pad.

9. The curved light-emitting substrate according to claim 4, wherein:
a thickness of the flexible pad is D0, wherein $10\ \mu m \leq D0 \leq 1000\ \mu m$ is defined.

10. The curved light-emitting substrate according to claim 1, wherein:
along the first direction, the flexible padding layer is between the second soldering pad and the array layer; the flexible padding layer includes a flexible pad, and an orthographic projection of the first soldering pad on the substrate is within an orthographic projection of the flexible pad on the substrate; and
the second soldering pad is electrically connected to the array layer through a via in the flexible padding layer.

11. The curved light-emitting substrate according to claim 10, wherein:
the flexible pad includes a plurality of opening structures; an opening structure of the plurality of opening structures passes through the flexible pad along the first direction; and along the first direction, the opening structure overlaps the light-emitting main body.

12. The curved light-emitting substrate according to claim 11, wherein:
the light-emitting element includes two first soldering pads; and an orthographic projection of the opening structure on the substrate is at least between orthographic projections of the two first soldering pads of the light-emitting element on the substrate.

13. The curved light-emitting substrate according to claim 1, wherein:
the second soldering pad includes two different second soldering pads; and
the array layer includes a first signal line and a second signal line; the light-emitting element includes two first soldering pads; and two first soldering pads in a same light-emitting element are electrically connected to the first signal line and the second signal line through the two different second soldering pads, respectively.

14. The curved light-emitting substrate according to claim 13, wherein:
along the first direction, the flexible padding layer is between the second soldering pad and the array layer, and the flexible padding layer includes a plurality of flexible pads; and
the second soldering pad covers a side of a flexible pad away from the substrate and extends from a side of the flexible pad, which is perpendicular to the substrate, to the side of the array layer facing the light-emitting element, to be electrically connected to the first signal line or the second signal line on the array layer.

15. The curved light-emitting substrate according to claim 13, wherein:
along the first direction, the flexible padding layer is between the second soldering pad and the array layer; and the second soldering pad is electrically connected to the first signal line or the second signal line through a first via in the flexible padding layer.

16. The curved light-emitting substrate according to claim 13, wherein:
the array layer includes a first metal layer and a second metal layer; and the array substrate includes a transistor, wherein:
a gate electrode of the transistor is in the first metal layer; source and drain electrodes of the transistor are in the second metal layer; and both the first signal line and the second signal line are in the second metal layer.

17. The curved light-emitting substrate according to claim 1, wherein:
the flexible padding layer is made of polyimide.

18. The curved light-emitting substrate according to claim 1, further including:
an electrical connection portion, wherein:
along the first direction, the electrical connection portion is between the first soldering pad and the second soldering pad; and
along the first direction, an orthographic projection of the first soldering pad on the substrate is within an orthographic projection of the electrical connection portion on the substrate, and the orthographic projection of the electrical connection portion on the substrate is within an orthographic projection of the second soldering pad on the substrate.

19. The curved light-emitting substrate according to claim 1, wherein:
curvatures of all regions on a display surface of the curved light-emitting substrate are same; and all of the plurality of flexible pads have a same thickness.

20. The curved light-emitting substrate according to claim 1, wherein:
the curved light-emitting substrate includes a first region and a second region; a curvature of the first region is greater than a curvature of the second region; a thickness of a flexible pad of the plurality of flexible pads in the first region is D1; and a thickness of a flexible pad of the plurality of flexible pads in the second region is D2, wherein D1>D2 is defined.

21. The curved light-emitting substrate according to claim 1, wherein:
the light-emitting element is a micro light-emitting diode or a sub-millimeter light-emitting diode.

* * * * *